US007618751B2

(12) United States Patent  
Sandstrom et al.

(10) Patent No.: US 7,618,751 B2
(45) Date of Patent: Nov. 17, 2009

(54) RET FOR OPTICAL MASKLESS LITHOGRAPHY

(75) Inventors: Torbjorn Sandstrom, Pixbo (SE); Hans Martinsson, Goteburg (SE)

(73) Assignee: Micronic Laser Systems AB, Taby (SE)

( * ) Notice: Subject to any disclaimer, the term of this patent is extended or adjusted under 35 U.S.C. 154(b) by 875 days.

(21) Appl. No.: 11/066,828

(22) Filed: Feb. 25, 2005

(65) Prior Publication Data

US 2005/0219502 A1    Oct. 6, 2005

Related U.S. Application Data

(60) Provisional application No. 60/547,614, filed on Feb. 25, 2004, provisional application No. 60/552,598, filed on Mar. 12, 2004.

(51) Int. Cl.
    B41J 2/47       (2006.01)
    G02B 26/12      (2006.01)
(52) U.S. Cl. ............. 430/5; 430/394; 430/396; 430/311; 347/239; 359/224.2; 250/492.2; 250/492.22
(58) Field of Classification Search .......... None
    See application file for complete search history.

(56) References Cited

U.S. PATENT DOCUMENTS

| 4,498,010 | A  | 2/1985  | Biechler et al. |
| 4,879,605 | A  | 11/1989 | Warkentin et al. |
| 4,902,133 | A  | 2/1990  | Tojo et al. |
| 4,989,255 | A  | 1/1991  | Manns et al. |
| 5,103,101 | A  | 4/1992  | Berglund et al. |
| 5,148,157 | A  | 9/1992  | Florence |
| 5,278,949 | A  | 1/1994  | Thayer |
| 5,340,700 | A  | 8/1994  | Chen et al. |
| 5,393,987 | A  | 2/1995  | Abboud et al. |
| 5,467,146 | A  | 11/1995 | Huang et al. |
| 5,471,305 | A  | 11/1995 | Yoneda et al. |
| 5,504,504 | A  | 4/1996  | Markandey et al. |
| 5,563,706 | A  | 10/1996 | Shibuya et al. |
| 5,774,254 | A  | 6/1998  | Berlin |
| 5,835,256 | A  | 11/1998 | Huibers |
| 5,870,176 | A  | 2/1999  | Sweatt et al. |
| 6,103,101 | A  | 8/2000  | Fragelli et al. |
| 6,118,535 | A  | 9/2000  | Goldberg et al. |
| 6,142,641 | A  | 11/2000 | Cohen et al. |
| 6,177,980 | B1 | 1/2001  | Johnson |
| 6,184,994 | B1 | 2/2001  | Freischlad |
| 6,201,545 | B1 | 3/2001  | Wong et al. |
| 6,261,728 | B1 | 7/2001  | Lin et al. |
| 6,285,488 | B1 | 9/2001  | Sandstrom et al. |
| 6,348,907 | B1 | 2/2002  | Wood |
| 6,489,984 | B1 | 12/2002 | Johnson |
| 6,504,644 | B1 | 1/2003  | Sandstrom et al. |
| 6,605,816 | B2 | 8/2003  | Sandstrom et al. |
| 6,618,185 | B2 | 9/2003  | Sandstrom et al. |
| 6,717,097 | B1 | 4/2004  | Sandstrom et al. |
| 6,717,650 | B2 | 4/2004  | Jain |
| 6,813,062 | B2 | 11/2004 | Sandstrom et al. |
| 6,833,854 | B1 | 12/2004 | Sandstrom et al. |
| 7,186,486 | B2 | 3/2007  | Walford et al. |
| 2001/0040670 | A1 | 11/2001 | Fielding |
| 2002/0197565 | A1 | 12/2002 | Wu |
| 2003/0107770 | A1 | 6/2003  | Klatchko et al. |
| 2004/0251430 | A1* | 12/2004 | Sandstrom ............... 250/492.2 |
| 2005/0053850 | A1 | 3/2005  | Askebjer et al. |

FOREIGN PATENT DOCUMENTS

| EP | 0568801     | 11/1993 |
| EP | 1369743     | 12/2003 |
| WO | WO-0049577  | 8/2000  |
| WO | WO-01/93303 | 12/2001 |

OTHER PUBLICATIONS

Written Opinion of the International Preliminary Examining Authority for International Application No. PCT/SE2005/000269 mailed Mar. 10, 2006.
Written Opinion of the International Searching Authorty for International Application No. PCT/SE2005/000269 mailed on Jul. 14, 2005.
"Reply to written opinion of Jul. 14, 2005" for International Application No. PCT/SE2005/000269 dated Dec. 8, 2005.
International Preliminary Report on Patentability for International Application No. PCT/SE2005/000269 completed May 31, 2006.
Finders, J. et al. "Low-k1 imaging: how low can we go?" in *Microlithographic Techniques in Integrated Circuit Fabrication II*, ed. C. A. Mack et al., Proceedings of SPIE vol. 4226 (2000).
International Search Report of International Application PCT/SE 2004/000936 mailed Sep. 21, 2004.
International Search Report of International Application No. PCT/SE 2005/000269 mailed on Jul. 14, 2005.
Kalus, C.K. et al. "Benchmarking of available rigorous electromagnetic field (EMF) simulators for phase-shift mask applications," Microelectronic Engineering, Sep. 2001, vol. 57-58, pp. 79-86.
Mak, G.Y.H. et al. "Placement sensitivity to aberration in optical imaging," 2003 IEEE Conference on Electron Devices and Solid-state Circuits, Dec. 16-18, 2003, pp. 475-478.

(Continued)

*Primary Examiner*—John A McPherson
*Assistant Examiner*—Daborah Chacko Davis
(74) *Attorney, Agent, or Firm*—Ernest J. Beffel, Jr.; Haynes Beffel & Wolfeld LLP

(57) ABSTRACT

The present invention relates to Optical Maskless Lithography (OML). In particular, it relates to providing OML with a recognizable relationship to mask and phase-shift mask techniques.

19 Claims, 25 Drawing Sheets

OTHER PUBLICATIONS

McCarthy, A.M. et al. "A Novel Technique for Detecting Llthographic Defects." IEEE Transactions on Semiconductor Manufacturing, vol. 1, No. 1, Feb. 1998, p. 10-15.

Newman, T. et al. "Evaluation of OPC Mask Printing with a Raster Scan Pattern Generator." Proceeding of SPIE, vol. 4691, Optical Microlithography XV, Jul. 2002, p. 1320-1330.

Rieger, M.L. et al. "Image Quality Enhancements for Raster Scan Lithography." Proceedings of SPIE, vol. 922, Optical/Laser Microlithography, Mar. 1988, p. 55-64.

Rieger, M.L. et al. "Lithographic Alternatives to PSM Repair." Proceedings of SPIE, vol. 1674, Optical/Laser Microlithography V, 1992, p. 609-617.

Stephanakis, A.C. et al. "Advances in 1 : 1 Optical Lithography," Proceedings of SPIE, Optical Microlithography VI, vol. 772. p. 74-85 (1987).

Wolf, S. "Advanced Lithography," p. 493-513 in Silicon Processing for the VLSI Era—vol. 1: Process Technology, Lattice Press, Inc. ,1986.

\* cited by examiner

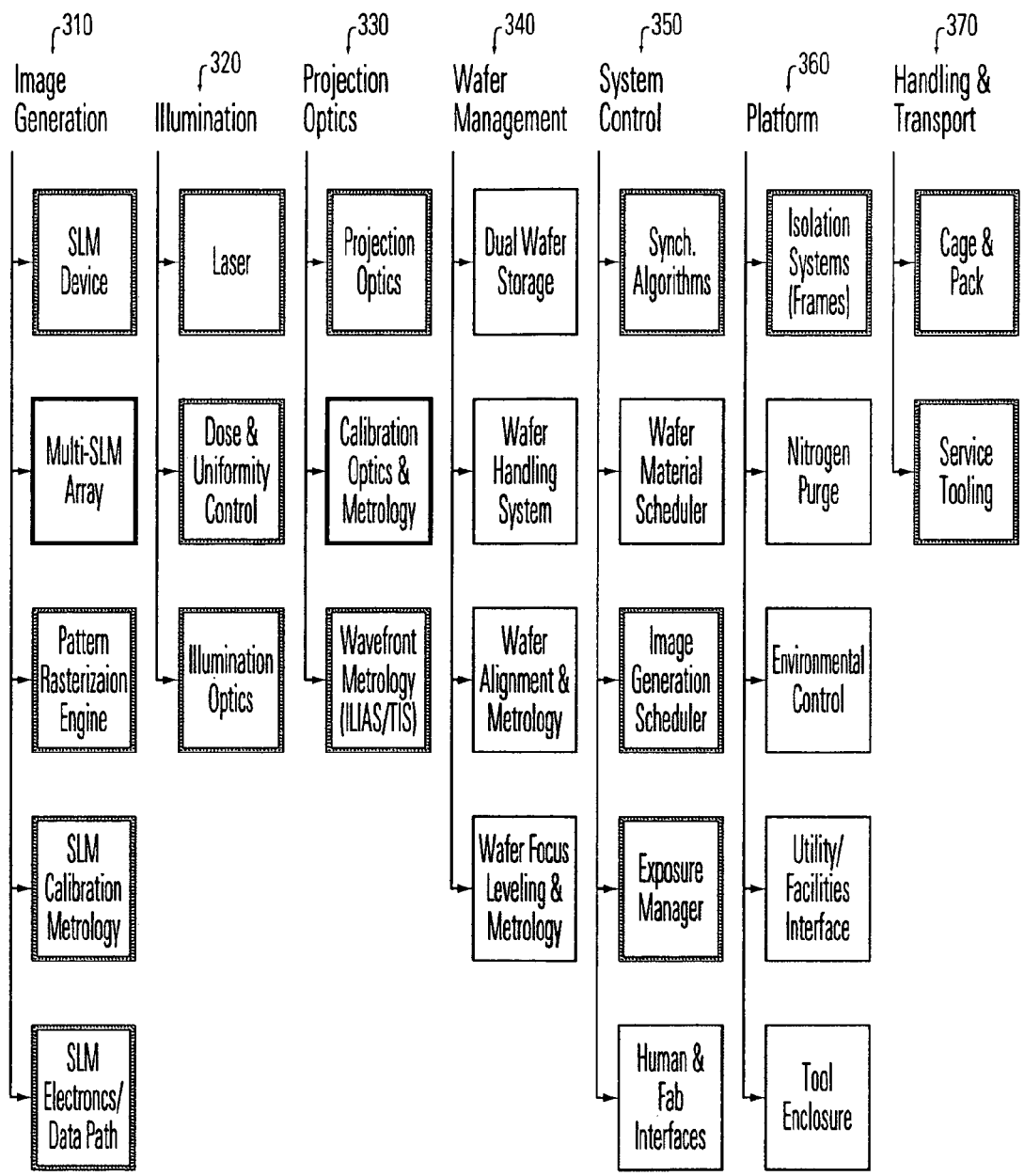
FIG. 3
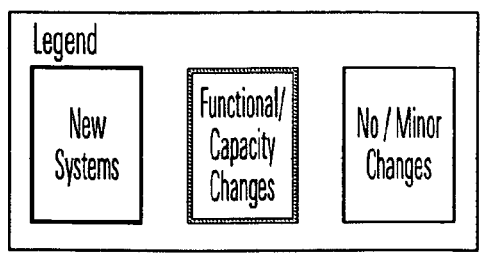

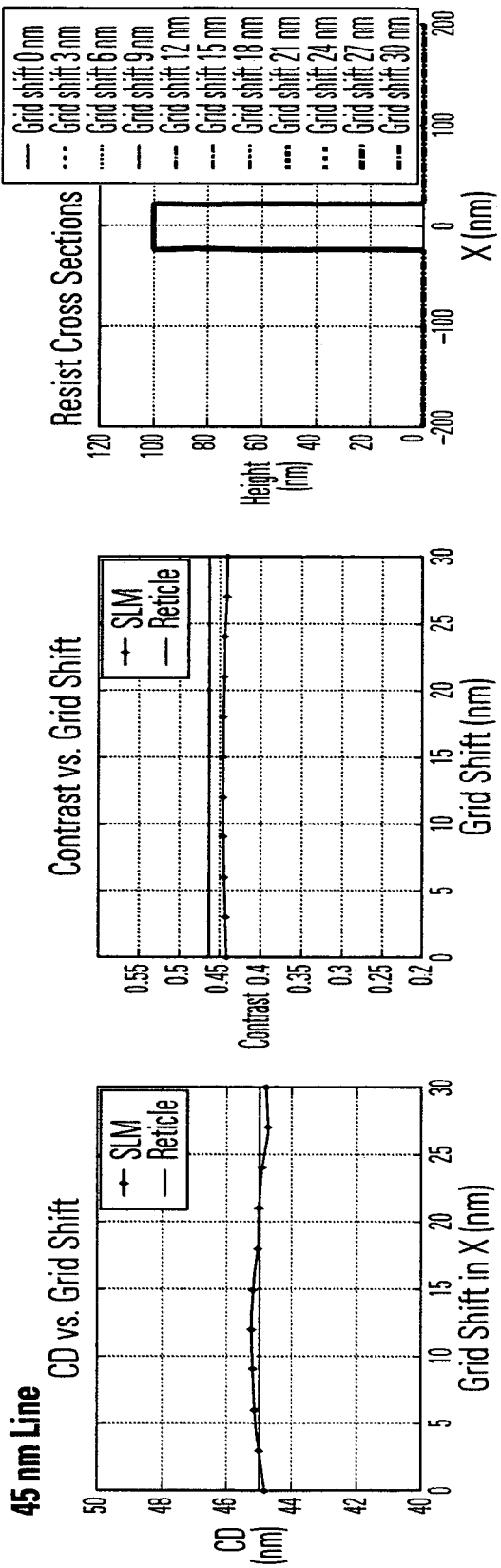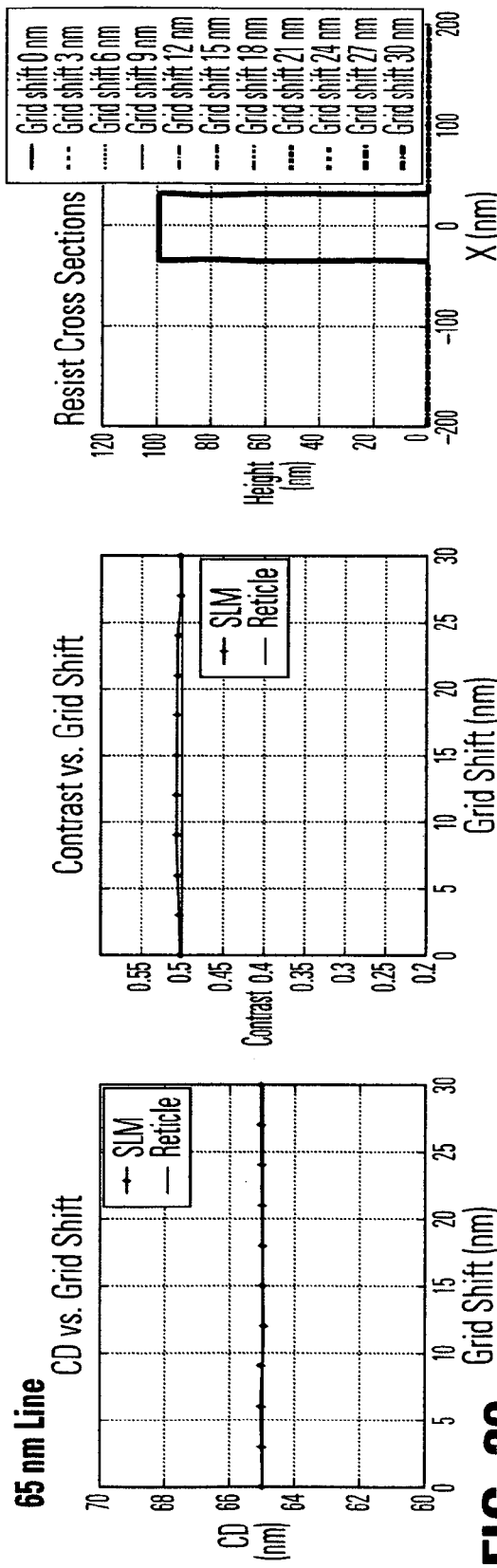
FIG. 20

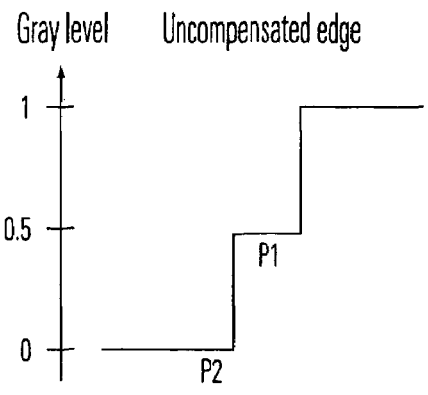
FIG. 22A     FIG. 22B
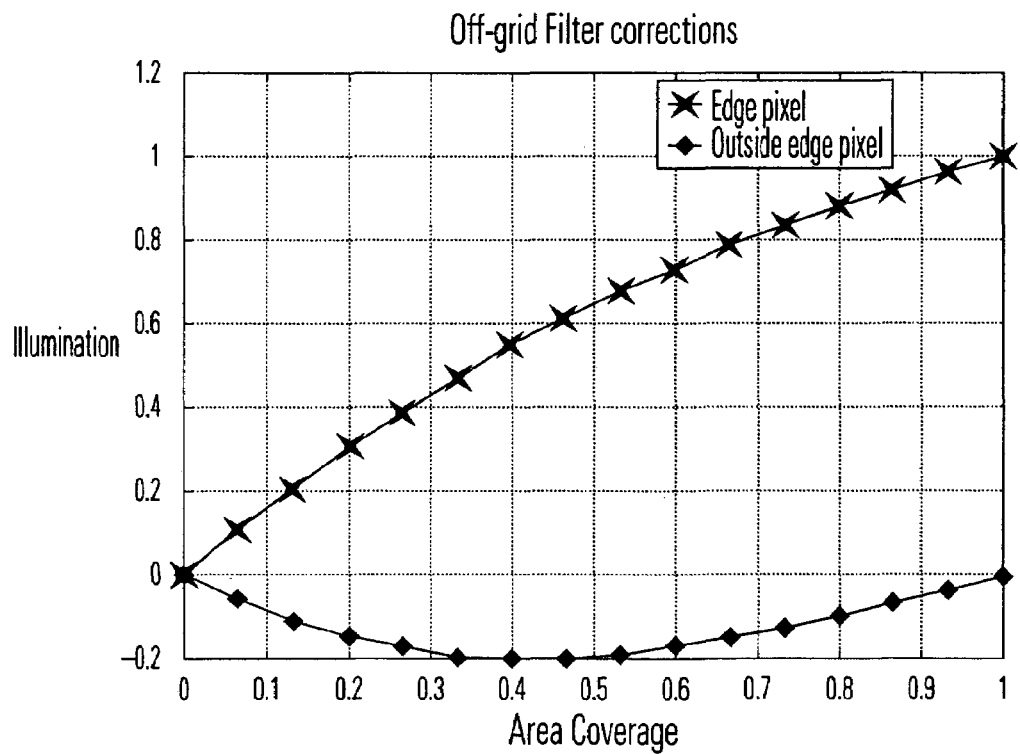
FIG. 23

PE vs. Grid Shift

NILS vs. Grid Shift

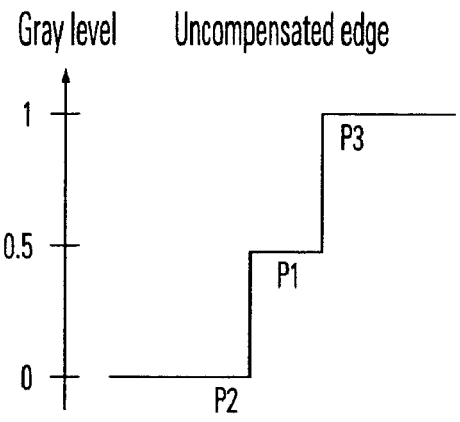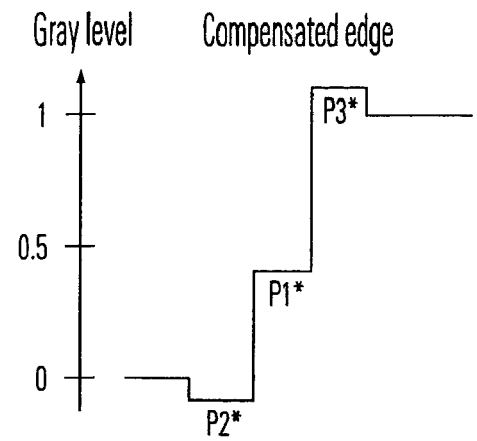
FIG. 27A          FIG. 27B
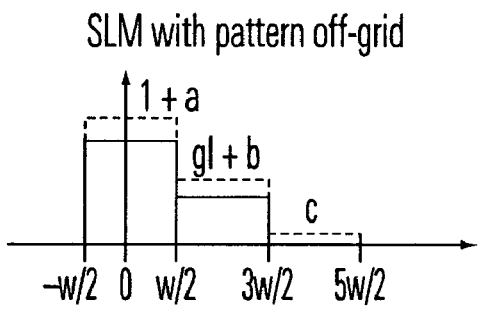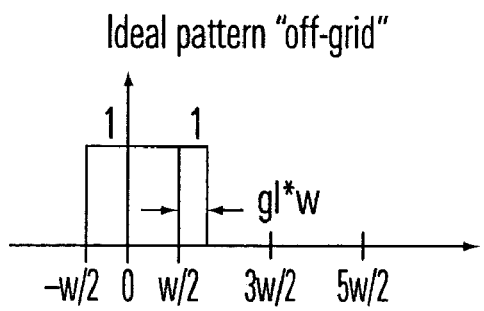
FIG. 28A          FIG. 28B
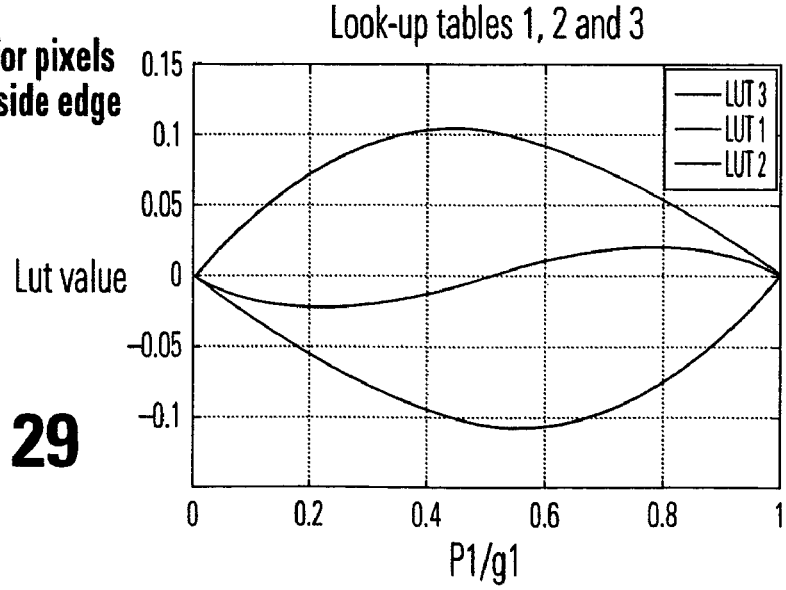
FIG. 29

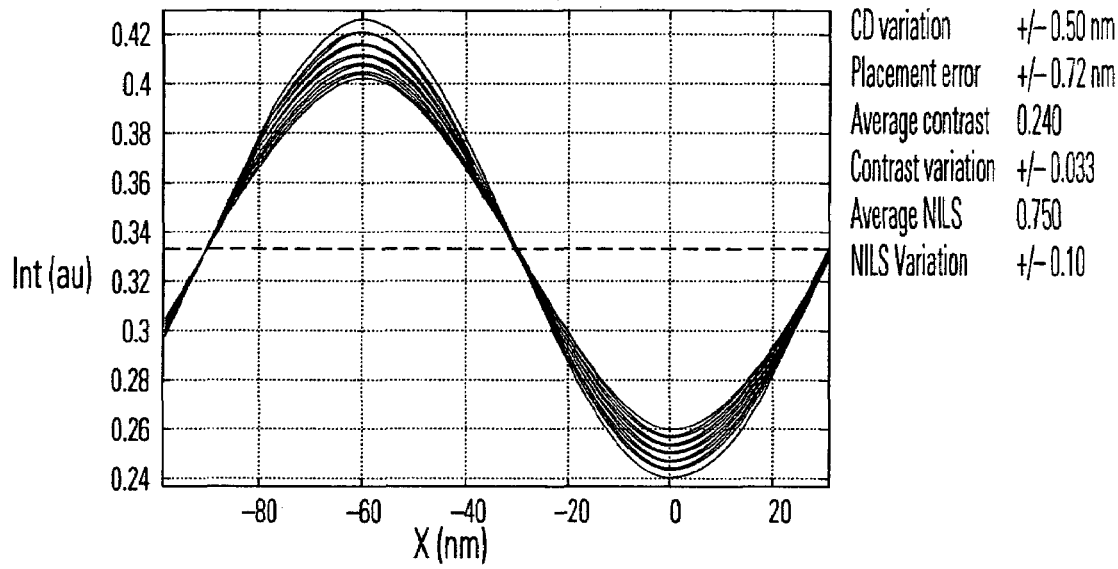
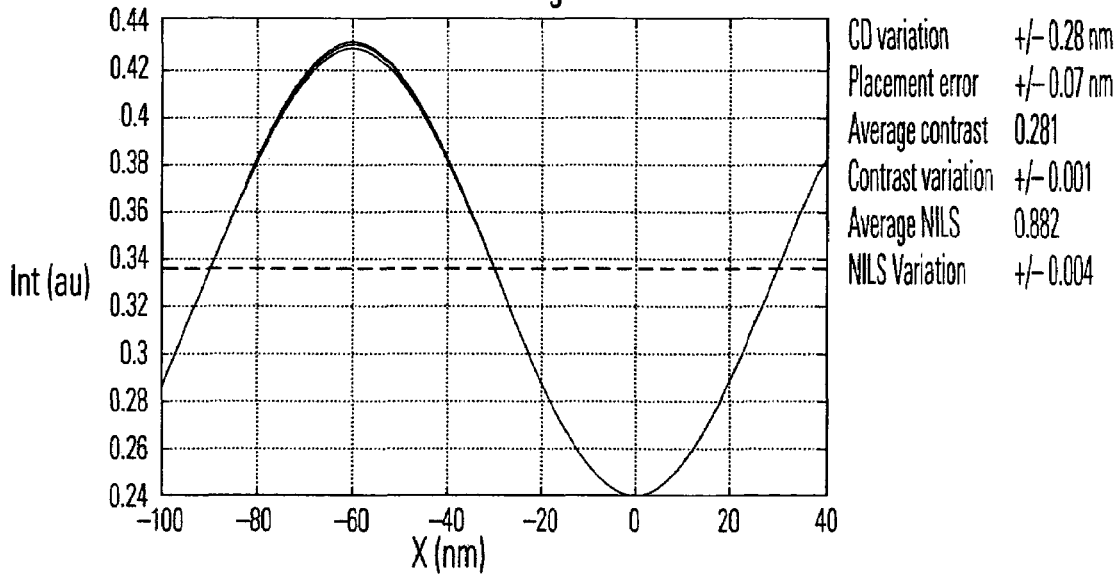
FIG. 30

RET FOR OPTICAL MASKLESS LITHOGRAPHY

RELATED APPLICATION

This provisional application claims the benefit of and incorporates by reference U.S. Provisional App. No. 60/547,614 by Torbjörn Sandström, entitled "RET for Optical Maskless Lithography" filed on 25 Feb. 2004 and U.S. Provisional App. No. 60/552,598 by Torbjörn Sandström and Hans Martinsson, entitled "RET for Optical Maskless Lithography (OML)" filed on 12 Mar. 2004.

Incorporated by reference to illustrate the technology applied in this application are several previously filed applications. These include: U.S. Provisional App. Nos. 60/415,509, entitled "Resolution Extensions in the Sigma 7000 Imaging SLM Pattern Generator" by inventors Torbjörn Sandström and Niklas Eriksson, filed on 1 Oct. 2002; No. 60/444,417, entitled "Further Resolution Extensions for an SLM Pattern Generator" by inventors Torbjörn Sandström and Niklas Eriksson, filed on 3 Feb. 2003; and No. 60/455,364, entitled "Methods and Systems for Process Control of Corner Feature Embellishment" by inventors Torbjörn Sandström, Hans Martinsson, Niklas Eriksson and Jonas Hellgren, filed on 17 Mar. 2003. These further include the international application designating the United States submitted and to be published in English, App. No. PCT/SE02/02310, entitled "Method and Apparatus for Patterning a Workpiece" by inventor Torbjörn Sandström and Peter Duerr, filed on 11 Dec. 2002 and claiming priority to the Swedish Application No. 0104238-1 filed on 14 Dec. 2001; and the international application designating the United States submitted and to be published in English, App. No. PCT/EP03/04283, entitled "Method and Apparatus for Controlling Exposure of a Surface of a Substrate" by inventors Torbjörn Sandström and Peter Duerr, filed on 24 Apr. 2003. These provisional and international applications are hereby incorporated by reference.

This application is related to the international application designating the United States submitted and published in English, App. No. PCT/SE02/2004/000936, which claims priority to U.S. patent application Ser. No. 10/460,765, entitled "Method for High Precision Printing of Patterns" by inventor Torbjörn Sandström, issued 21 Dec. 2004 as U.S. Pat. No. 6,833,854. This application is further related to U.S. patent application Ser. No. 10/462,010, "Methods and Systems for Improved Boundary Contrast" by inventor Torbjörn Sandström, both filed on 12 Jun. 2003. The international application and both of the US applications are hereby incorporated by reference. It is also related to U.S. patent application Ser. No. 09/954,721, entitled "Graphics Engine for High Precision Lithography" by inventors Martin Olsson, Stefan Gustavson, Torbjörn Sandström and Per Elmfors, filed on 12 Sep. 2001, which is hereby incorporated by reference ("Graphics Engine application"). It is further related to U.S. patent application Ser. No. 10/238,220, entitled "Method and Apparatus Using an SLM" by inventors Torbjörn Sandström and Jarek Luberek, filed on 10 Sep. 2002. ("Blanket Gray Calibration application"), which claims the benefit of provisional Patent Application No. 60/323,017 entitled "Method and Apparatus Using an SLM" by inventors Torbjörn Sandström and Jarek Luberek, filed on 12 Sep. 2001, both of which are hereby incorporated by reference. It is also related to U.S. patent application Ser. No. 09/992,653 entitled "Reticle and Direct Lithography Writing Strategy" by inventor Torbjörn Sandström, filed on 16 Nov. 2001 which is a continuation of Application No. 90/665,288 filed 18 Sep. 2000, which is hereby incorporated by reference ("Writing Strategy application").

BACKGROUND OF THE INVENTION

The present invention relates to Optical Maskless Lithography (OML). In particular, it relates to providing OML with a recognizable relationship to mask and phase-shift mask techniques.

For general background regarding the types of phase-shift mask techniques analogous to the inventions disclosed herein, reference is suggested to the article by Wilhelm Maurer, entitled "Application of Advanced Phase-Shift Masks", which was accessible at http://www.reed-electronics.com/semiconductor/index.asp?layout=articlePrint&articleID=CA319210, as of Mar. 12, 2004.

Moore's law promises exponential growth in computer power at diminishing prices. This dynamic growth of processing power might lead one to think that semiconductor device manufacturing would be an adventuresome business, like wild-catting for oil. Just the opposite is true. Because manufacturing batches are very valuable and manufacturing processes are sensitive to even small mistakes, semiconductor device manufacturing is a conservative business. Qualification cycles and standards for new equipment and modifications of old equipment are lengthy and demanding. Even a small change is vetted extensively, before being released to production.

Applications commonly assigned, many of which have overlapping inventorship, have described an SLM-based system well-adapted to make masks. Additional work has been done to adapt the SLM technology to direct writing of chips. However, the acceptance cycle is most challenging.

An opportunity arises to introduce an SLM-based system that emulates patterns produced with traditional reticles, including reticles with phase shift patterns and OPC features. Producing patterns directly from an SLM that have small and understandable differences from patterns produced by masks has the potential to enhance user confidence and speed acceptance of a new system. It also can provide a direct path from prototyping small batches with direct writing to tooling for large batches with traditional reticles. Better, more easily configured and controlled, more resilient and transparent components and systems may result.

SUMMARY OF THE INVENTION

The present invention relates to Optical Maskless Lithography (OML). In particular, it relates to providing OML with a recognizable relationship to mask and phase-shift mask techniques. Particular aspects of the present invention are described in the claims, specification and drawings.

BRIEF DESCRIPTION OF THE DRAWINGS

FIG. 3 outlines an OML system architecture.

Figure 5:
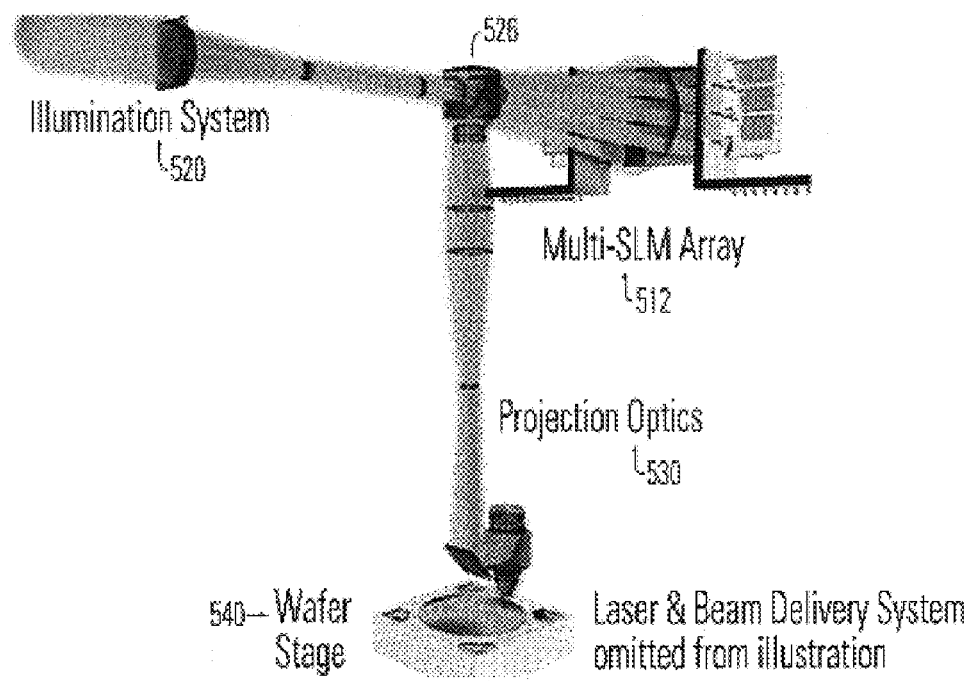

A preliminary optical design for the projection optics is shown in FIG. 5.

Figure 6:
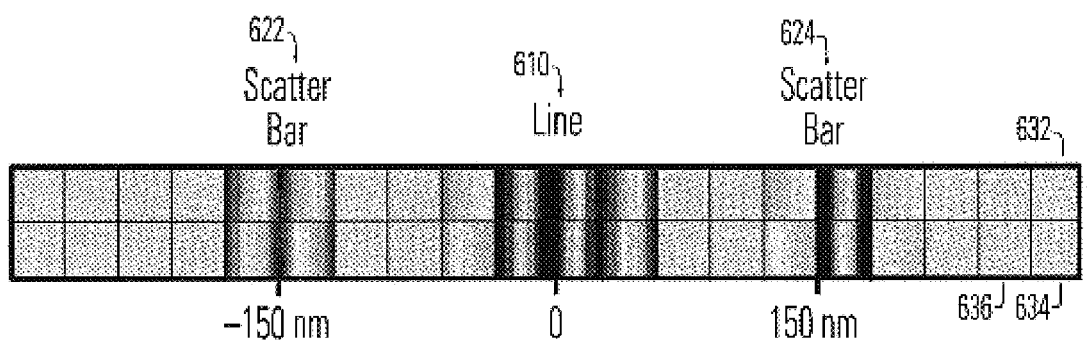

FIG. 6 shows an example of a mirror tilt configuration.

Figure 7:
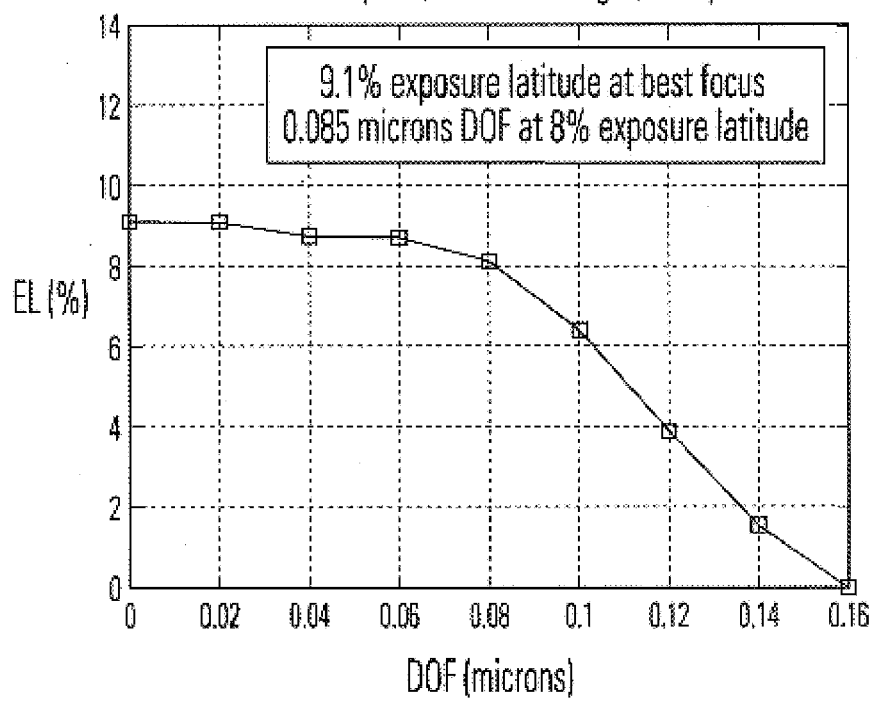

FIG. 7 shows the resulting common process window in resist for 60 nm lines at 130, 200, 400, 600 and 1200 nm pitch.

Figure 8:
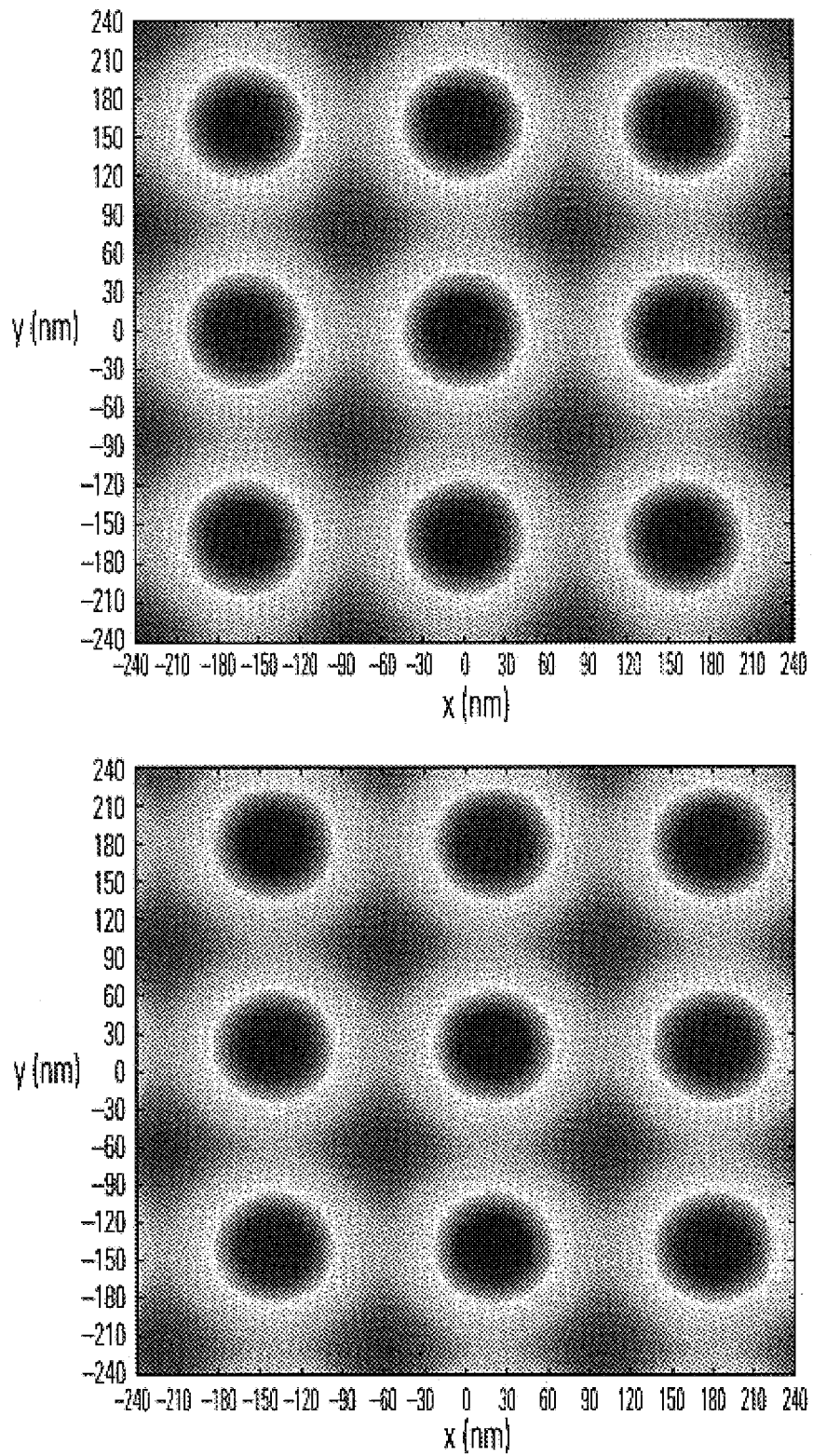

FIG. 8 shows two aerial images of 60 nm contact holes.

Figure 9:
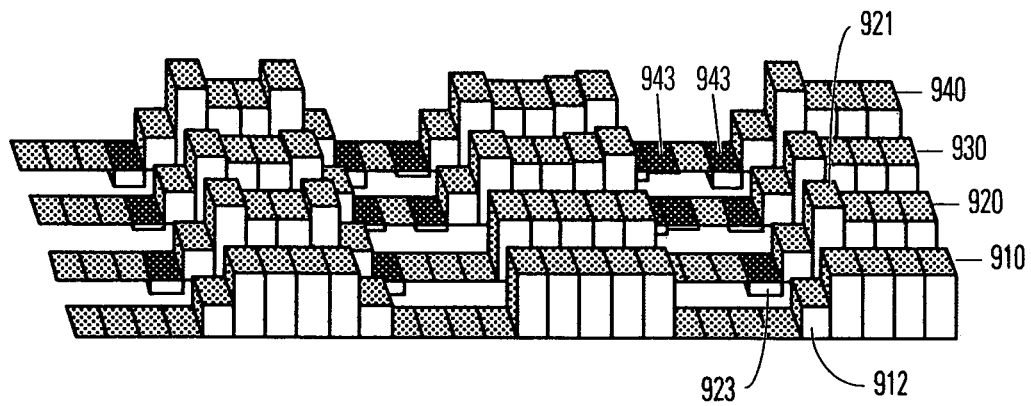

FIG. 9 depicts one-dimensional digital filtering of the bitmap.

Figure 10:
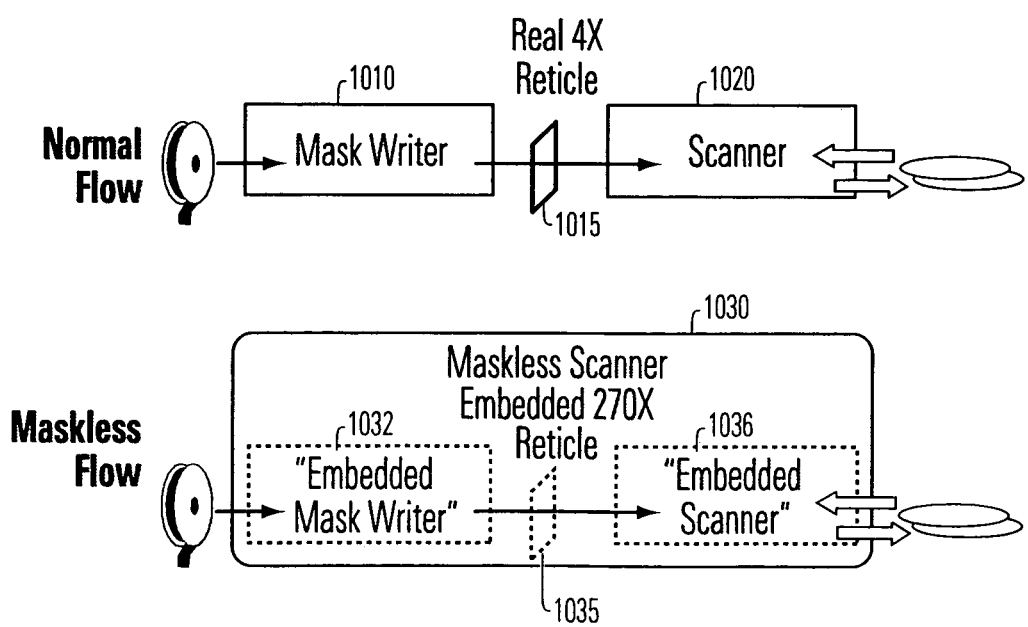

FIG. 10 shows the similar functions of a maskless tool and a mask writer and scanner in cascade.

Figure 11A:
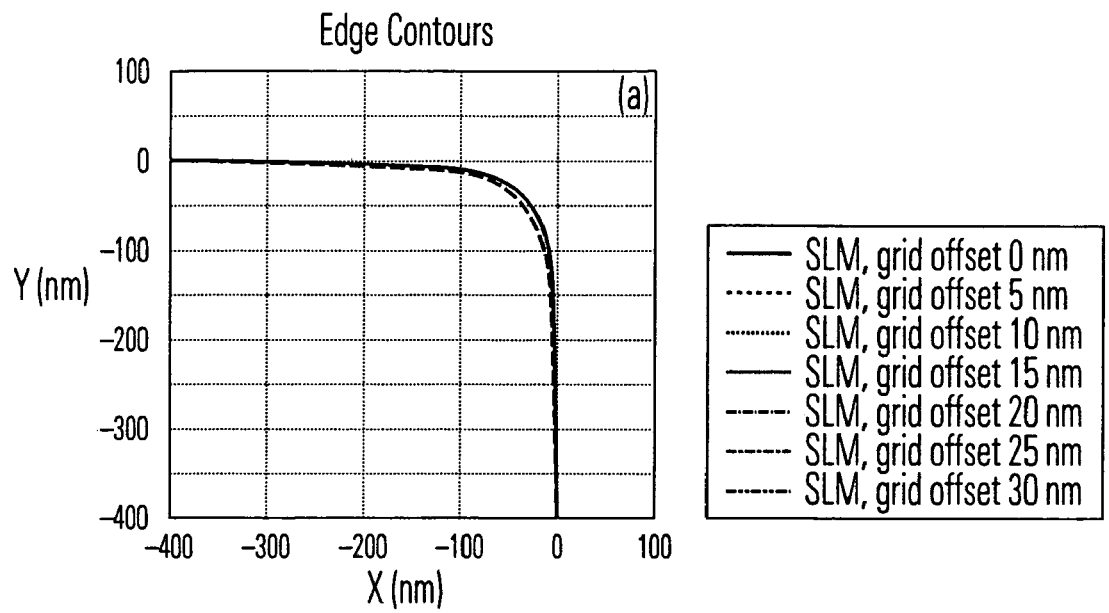
Figure 11B:
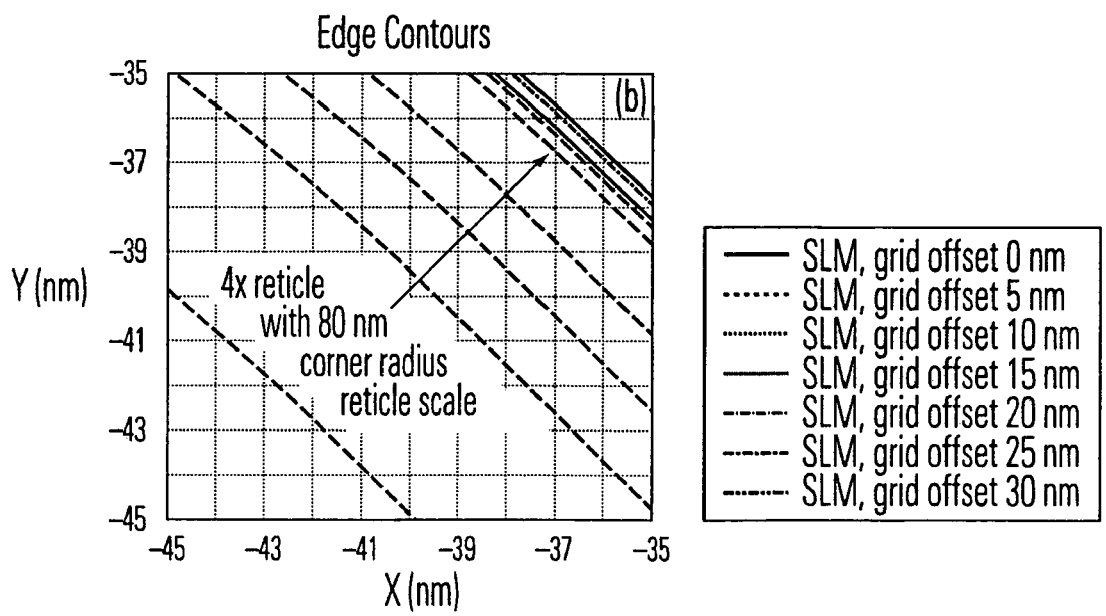

FIGS. 11a-11b depict aerial image simulations of corners from reticles.

FIGS. 12a-12b depict aerial image simulations of double-dipole decomposition.

The three graphs in FIG. 13 show the ED windows using a 6% attenuated PSM reticle, the SLM image on grid and the SLM image off grid.

Figure 14A:
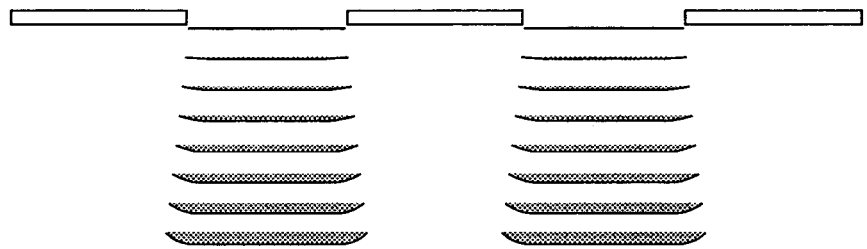
Figure 14B:
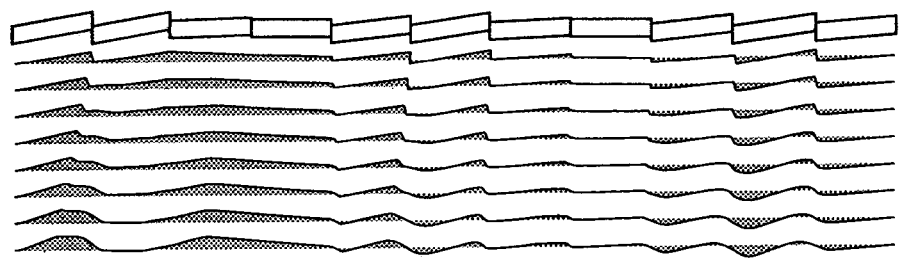

FIGS. 14a-14b depict near-field wave fronts from a transmission reticle and a micro-mirror SLM.

Figure 15:
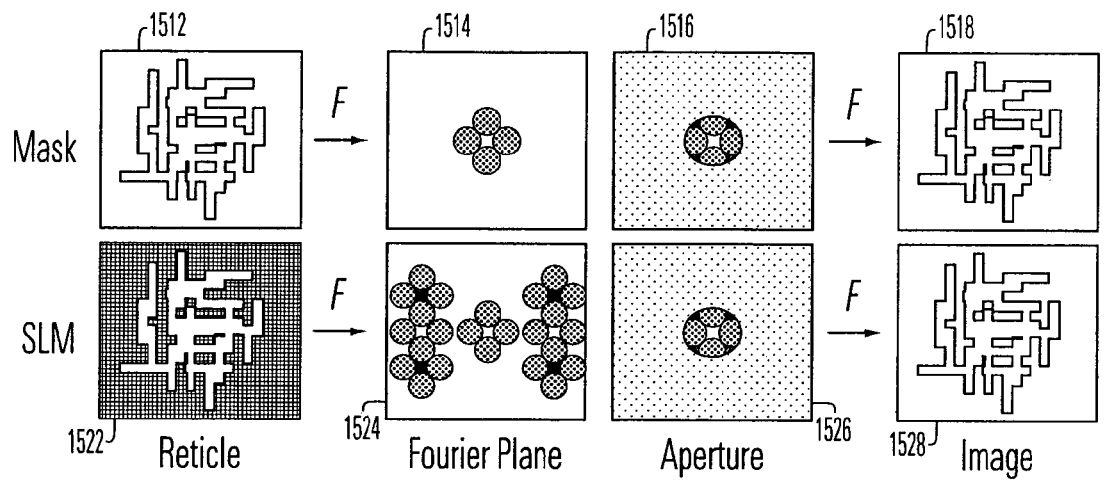

FIG. 15 shows one way of looking at the function of a diffractive SLM image: as 2D modulation and filtering.

Figure 16:
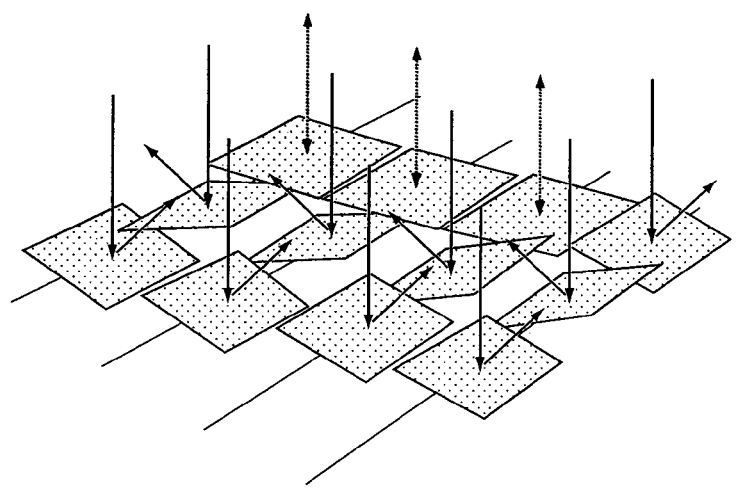

FIG. 16 depicts an alternating row layout used in some SLMs.

FIGS. 17a-17d depict phase modulation mirror types and trajectories in the complex plane.

FIGS. 18a-18d depict various data paths.

Figure 19:
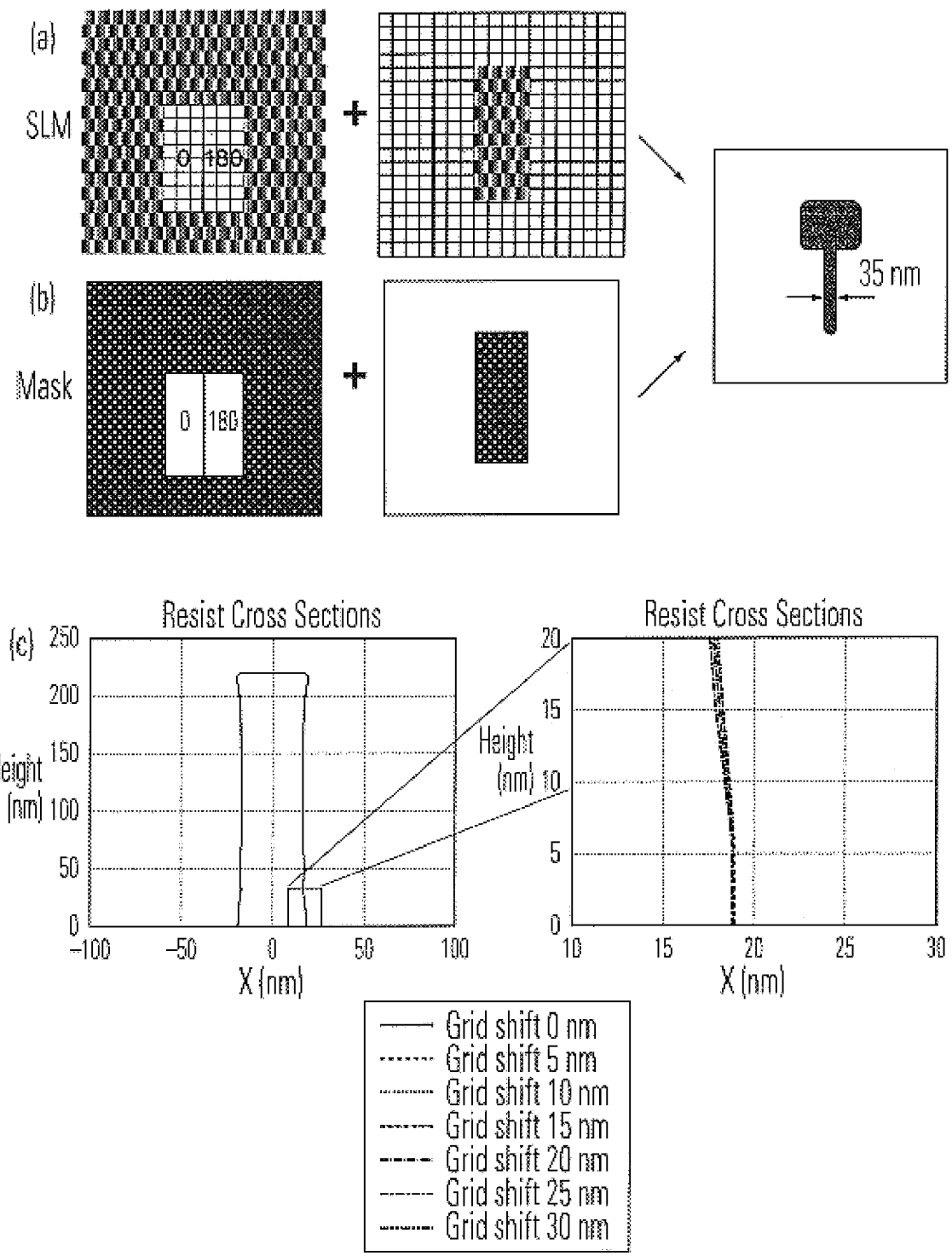
Figure 21A:
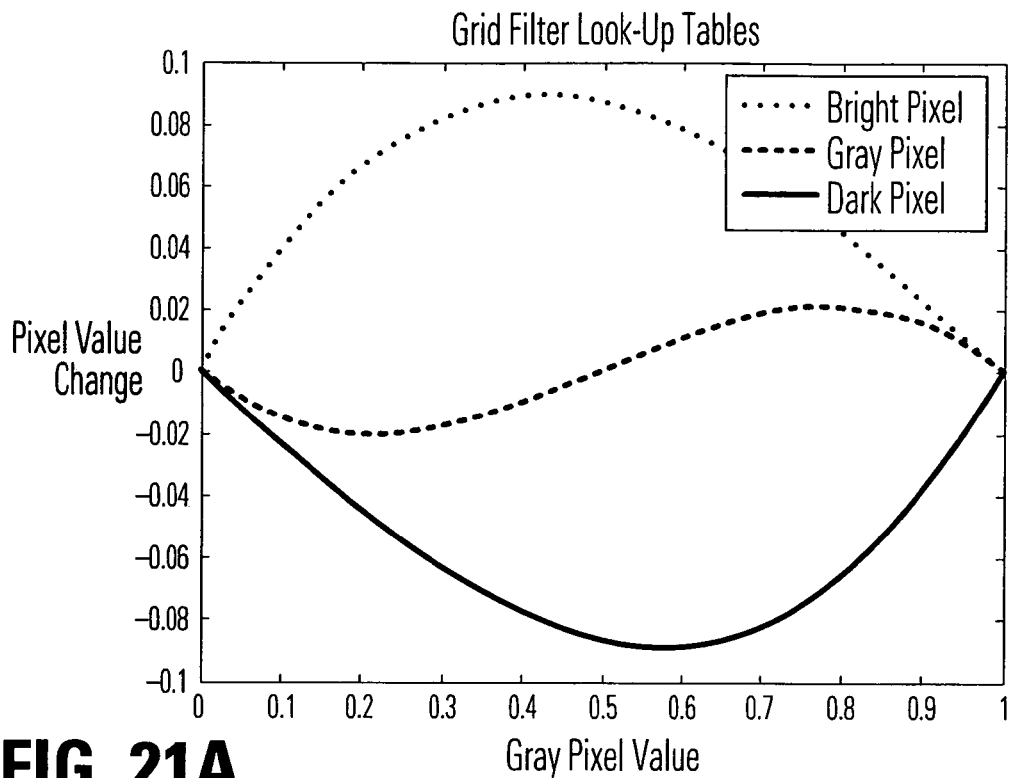
Figure 21B:
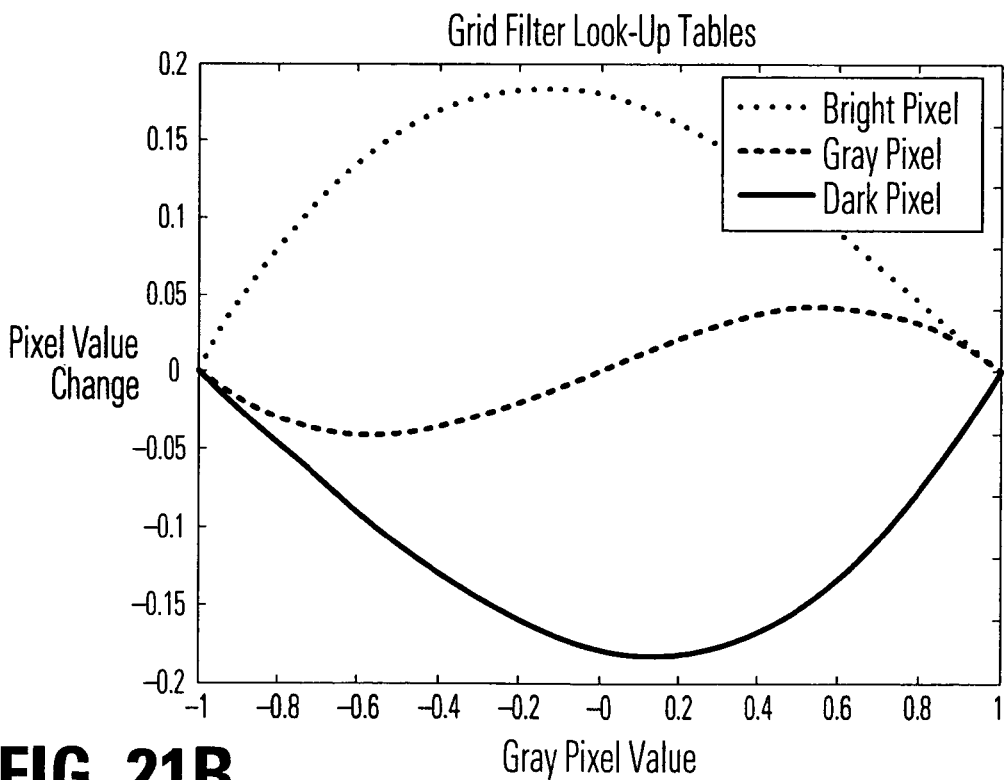
Figure 21C:
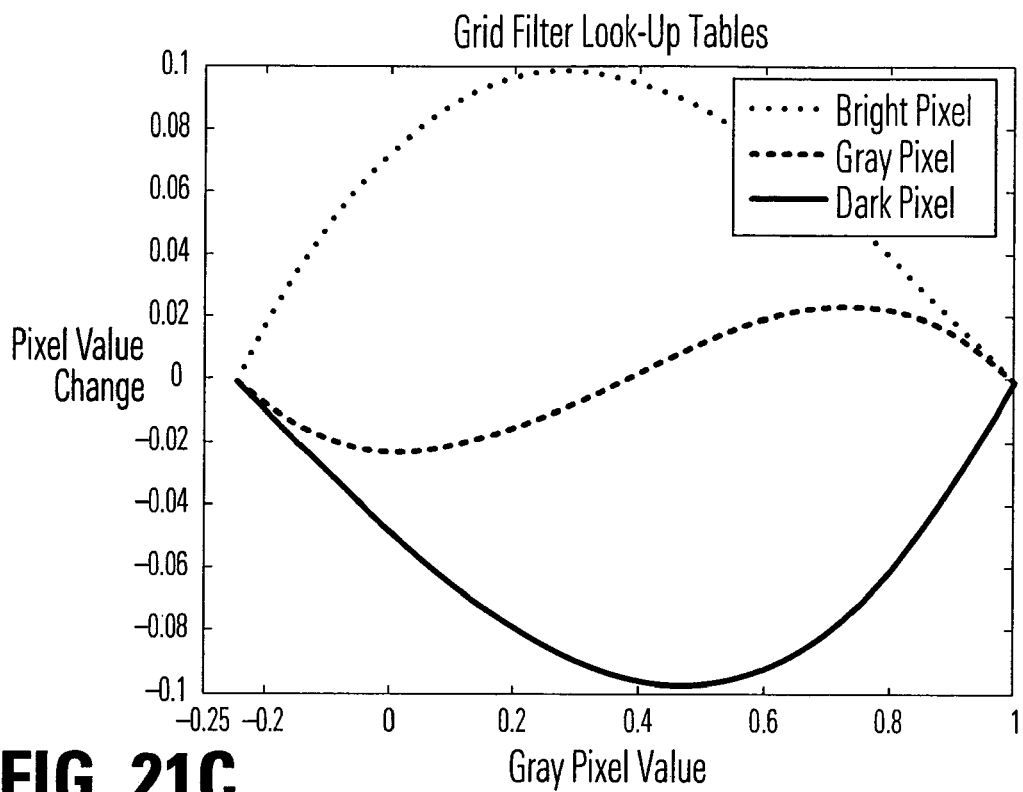
Figure 21D:
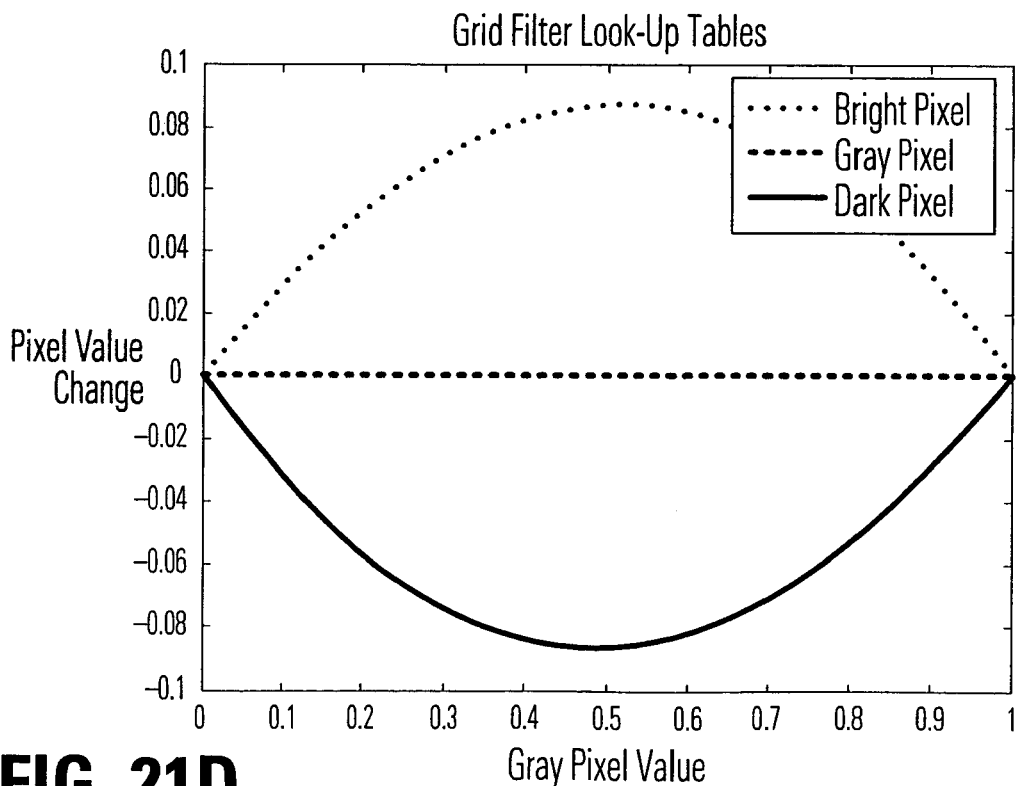
Figure 21E:
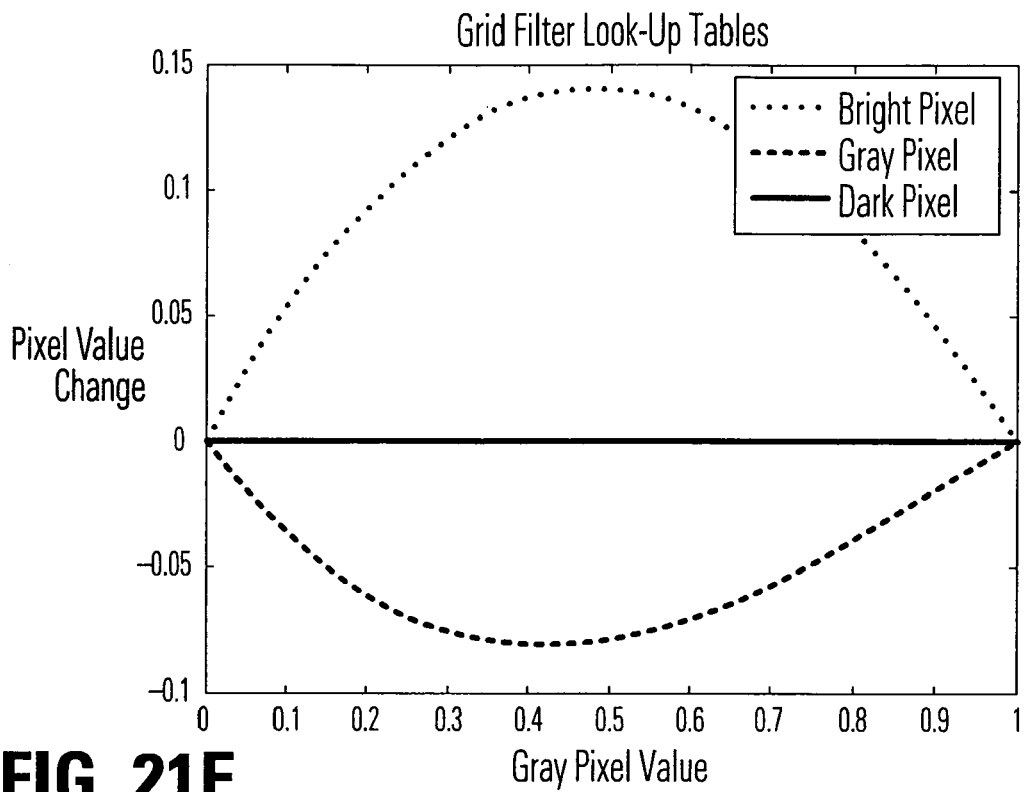
Figure 21F:
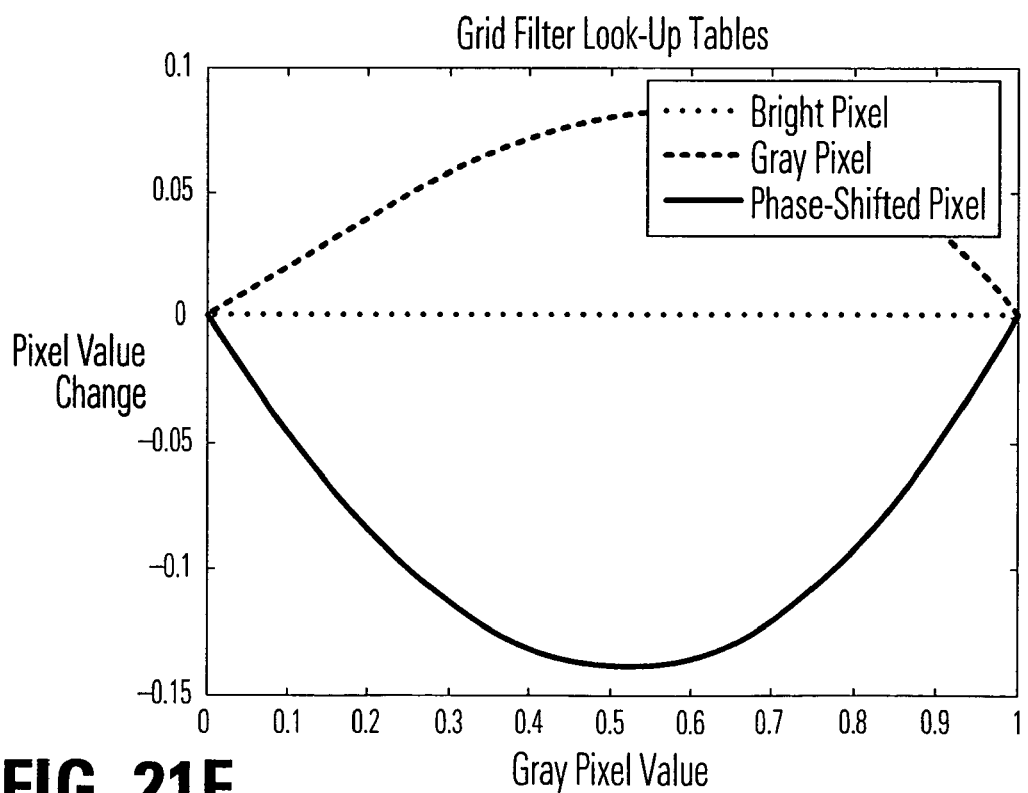

FIG. 19 presents a schematic description of how to print a 35 nm transistor gate with a phase edge and a trim mask using SLMs and reticles.

FIG. 20 depicts printing of Chromeless Phase Lithography (CPL) semi-isolated lines with 65 and 45 nm line widths.

FIGS. 21a-f graph look-up tables (LUTs) calculated to implement the digital filtering. (FIGS. 22-34 are unused.)

FIG. 22a-b illustrate an embodiment of an off-grid correction filter according to the present invention.

FIG. 23 illustrates resulting LUT functions for a gray and dark pixel.

FIG. 24a-26b illustrate calculated improvements due to the inventive off-grid filter.

FIG. 27a-b illustrate another embodiment of an off-grid correction filter according to the present invention.

FIG. 28a illustrates an SLM with amplitude transmission modulated pixels.

FIG. 28b illustrates an ideal pattern from a binary mask.

FIG. 29 illustrates look up tables for pixels on and outside an edge.

FIG. 30 illustrates performance comparison illumination table and grid filter (off-grid filter).

Figure 31A:
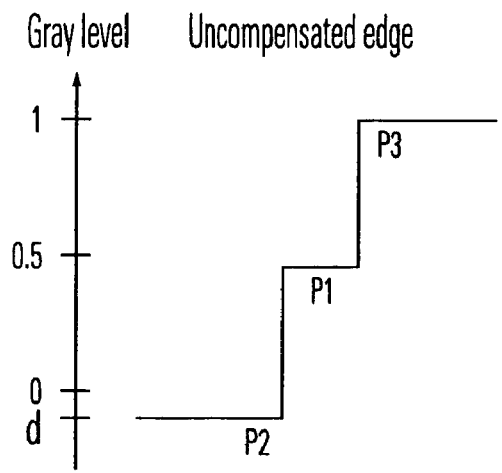

FIG. 31a illustrates an uncompensated edge in a pattern.

Figure 31B:
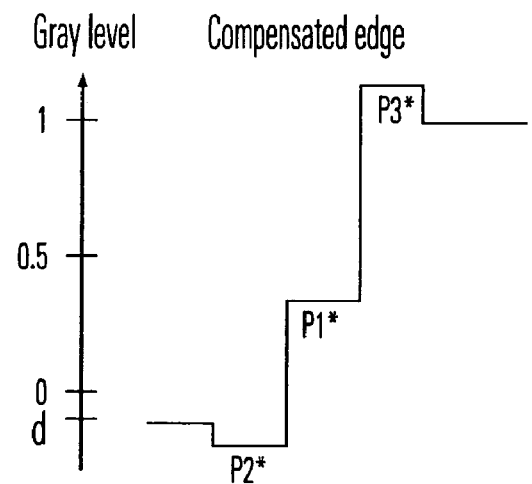

FIG. 31b illustrates a compensated edge in a pattern.

Figure 32A:
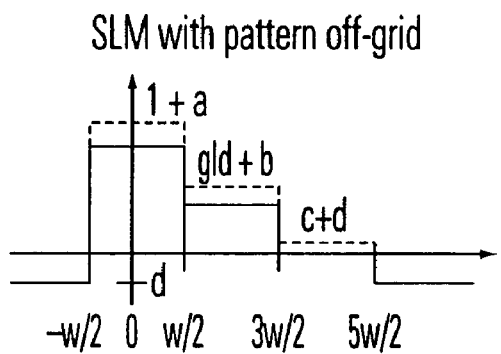

FIG. 32a illustrates an SLM with amplitude transmission modulated pixels.

Figure 32B:
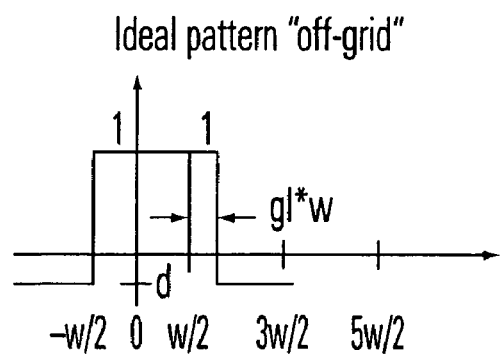

FIG. 32b illustrates an ideal pattern from a binary mask.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Introduction

For low-volume runs, Optical Maskless Lithography (OML) provides an attractive alternative for mask-based lithography due to ever-increasing reticle costs. Foundries and ASIC fabs are finding that reticles are an increasingly dominating part of their manufacturing costs, especially for small series production. Optical Maskless Lithography provides a cost-effective alternative while maintaining process compatibility with existing fab technologies.

An Optical Maskless Scanner with a wavelength of 193 nm and 0.93 NA for resolution compatible with the 65 nm node is achievable. A throughput of 5 wph (300 mm) is desired.

The spatial light modulator (SLM) and data path technologies, developed by Micronic for the SIGMA line of maskwriters, provide a computer-controlled reticle that possesses imaging and optical properties similar to a normal reticle. The proposed Optical Maskless Scanner combines an array of multiple SLMs with the ASML TWINSCAN platform and uses 193 nm technology to ensure optimal process transparency in the fab. The reticle stage and infrastructure is replaced with an image generating subsystem consisting of a set of SLMs and a data delivery system capable of providing nearly 250 GPixels/sec. A newly designed optical column has a maximum NA of 0.93, making it compatible with ASML's TWINSCAN series of conventional lithography scanners, including support for all illumination modes available in conventional scanners.

Maskless Lithography approaches require high data volumes. Unlike e-beam, Optical Maskless Lithography has no inherent physical throughput limitations. SLM pattern generation technology lends itself to throughput scaling. The pattern conversion path from the input file through the rasterizer and SLM down to the image in the resist can be made parallel by using multiple SLMs simultaneously. While the challenge would be formidable for a random pattern, the nature of repeated scanner fields on the wafer simplifies the problem.

The large commonality in the image formation techniques between the Optical Maskless Scanner and a conventional scanner is expected to result in producing the same level of imaging performance on both types of systems. The image generation process adopts existing enhancement techniques (e.g. OPC) from mask-based lithography, facilitating the transition from maskless to mask-based mass production as production ramps up. The table below shows the preliminary systems specifications for one embodiment of an OML tool.

| Parameter | Specification |
| --- | --- |
| PO Interface | |
| PO Numerical Aperture | 0.7 to 0.93 |
| PO magnification | 267× |
| Usable Depth of Focus (uDOF) | ±0.1 μm |
| Pixel Size @ Wafer Plane | 30 nm |
| Throughput | |
| 300 mm wafers: 125 exposures, 16 × 32 mm, 30 mJ/cm² dose | 5 wph |
| 200 mm wafers: 58 exposures, 16 × 32 mm, 30 mJ/cm² dose | 10 wph |

Using Micro-Mirrors as a Reticle

Optical Maskless Lithography strives to combine conventional (i.e. mask-based) photolithography scanners with a fixed array of multiple micro-mechanical SLMs used to generate the mask pattern in real-time, in place of a reticle.

Figure 1:
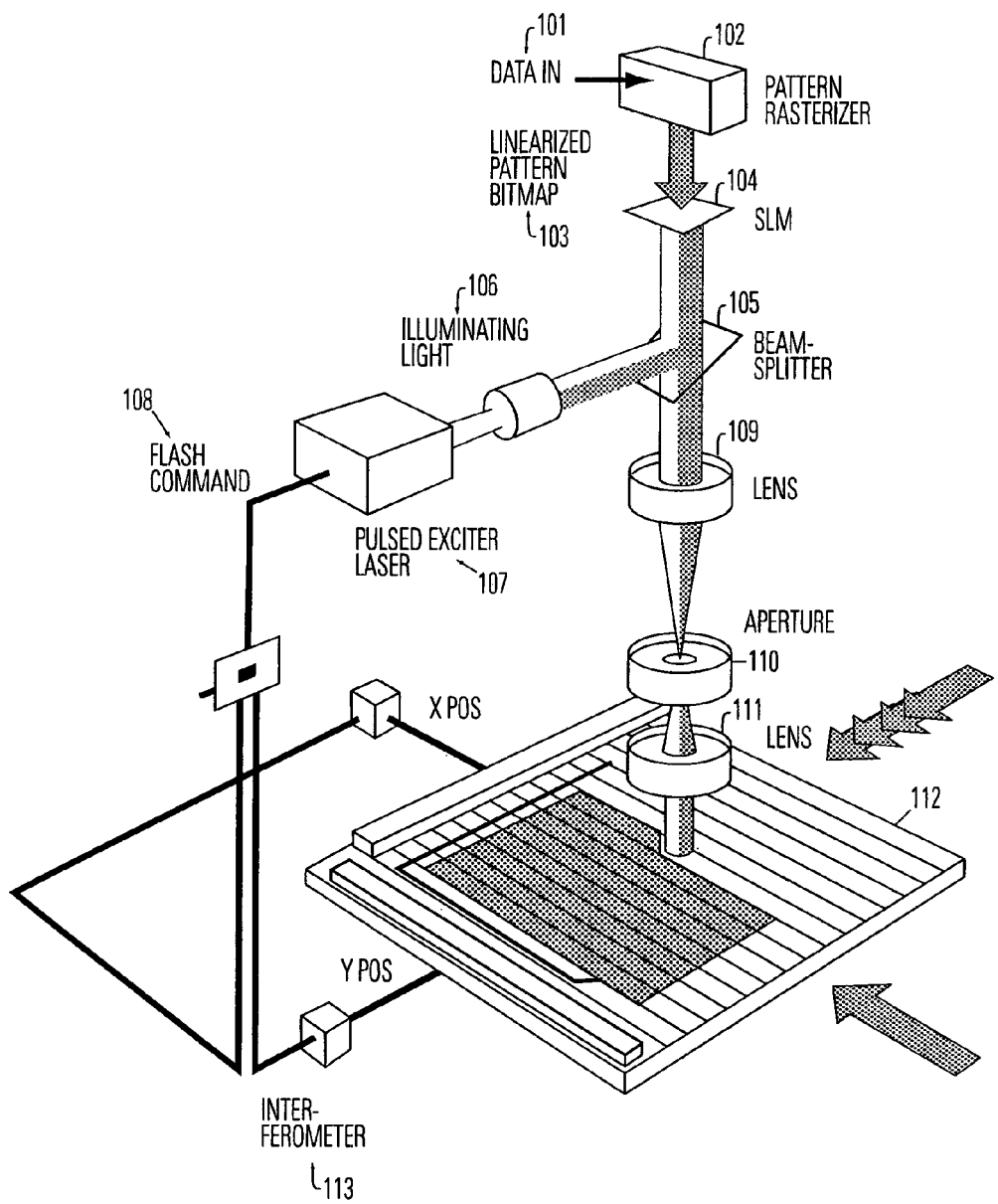
FIG. 1 provides a schematic representation of the Optical Maskless Lithography (OML) image generating system.

FIG. 1 provides a schematic representation of the Optical Maskless image generating system. Aspects of an SLM pattern generator are disclosed in the references identified above. The workpiece to be exposed sits on a stage 112. The position of the stage is controlled by precise positioning device, such as paired interferometers 113.

The workpiece may be a mask with a layer of resist or other exposure sensitive material or, for direct writing, it may be an integrated circuit with a layer of resist or other exposure sensitive material. In the first direction, the stage moves continuously. In the other direction, generally perpendicular to the first direction, the stage either moves slowly or moves in steps, so that stripes of stamps are exposed on the workpiece. In this embodiment, a flash command 108 is received at a pulsed excimer laser source 107, which generates a laser pulse. This laser pulse may be in the deep ultraviolet (DUV) or extreme ultraviolet (EUV) spectrum range. The laser pulse is converted into an illuminating light 106 by a beam conditioner or homogenizer.

A beam splitter 105 directs at least a portion of the illuminating light to an SLM 104. The pulses are brief, such as only 20 ns long, so any stage movement is frozen during the flash. The SLM 104 is responsive to the datastream 101, which is processed by a pattern rasterizer 102. In one configuration, the SLM has 2048×512 mirrors that are 16×16 μm each and have a projected image of 80×80 nm. In another configuration, the SLM has mirrors that are 8×8 μm with a much smaller projected image. It includes a CMOS analog memory with a micro-mechanical mirror formed half a micron above each storage node.

The electrostatic forces between the storage nodes and the mirrors actuate the mirrors. The device works in diffraction mode, not specular reflectance, and needs to deflect the mirrors by only a quarter of the wavelength (62 nm at 248 nm or 48 nm at 193 nm) to go from the fully on-state to the fully off-state. To create a fine address grid the mirrors are driven to on, off and 63 intermediate values. The pattern is stitched together from millions of images of the SLM chip. Flashing and stitching proceed at a rate of 1000 to 4000 stamps per second. To reduce stitching and other errors, the pattern is written two to four times with offset grids and fields. Furthermore, the fields may be blended along the edges.

The mirrors are individually calibrated. A CCD camera, sensitive to the excimer light, is placed in the optical path in a position equivalent to the image under the final lens. The SLM mirrors are driven through a sequence of known voltages and the response is measured by the camera. A calibration function is determined for each mirror, to be used for real-time correction of the grey-scale data during writing. In the data path, the vector format pattern is rasterized into grey-scale images, with grey levels corresponding to dose levels on the individual pixels in the four writing passes. This image can then be processed using image processing. The final step is to convert the image to drive voltages for the SLM. The image processing functions are done in real time using programmable logic. Through various steps that have been disclosed in the related patent applications, rasterizer pattern data is converted into values 103 that are used to drive the SLM 104.

In this configuration, the SLM is a diffractive mode micromirror device. A variety of micromirror devices have been disclosed in the art. In an alternative configuration, illuminating light could be directed through a micro-shutter device, such as in LCD array or a micromechanical shutter.

The OML uses an array of SLMs, based on an extension of the 1 MPixel SLM technology used in Micronic's SIGMA mask-writers. The SLMs are illuminated by a pulsed excimer laser source through an optical system in front of the SLMs, which project a de-magnified image of the SLM on to the wafer. In the OML tool, each SLM pixel is an 8 μm×8 μm tilting mirror. When all mirrors are flat (i.e. relaxed), the SLM surface acts as a mirror and reflects all light specularly through the projection optics. This corresponds to clear areas on the corresponding reticle. When the mirrors are fully tilted, the surface is non-flat and the light is lost by being diffracted outside of the stop of the projection optics; thus, dark areas are produced on the wafer. Intermediate tilt positions will reflect part of the light into the projection optics, i.e. gray, areas are produced.

The SLM chip consists of a CMOS circuit similar to those in reflection LCD devices, and functionally similar to the circuitry for a computer TFT screen. Pixel cells include a storage capacitor and transistor to allow the storage node to be charged to an analog voltage and then isolated. Pixels are addressed in sequence during the loading of a new frame by normal matrix addressing, i.e. by scanning every column and row and loading an analog voltage into each one. The area is divided into a large number of load zones that are scanned simultaneously, so that the entire chip is reloaded in less than 250 msec.

In pixel cells, the storage node is connected to an electrode under part of the mirror. The electrostatic force pulls the mirror and causes it to tilt. The exact angle is determined by the balance between the analog voltage and the stiffness in the flexure hinge, i.e. the device has analog action and the loaded voltage can control the tilt angle in infinitely small increments. The actual resolution is limited by the DACs providing the drive voltages.

Intuitively, it would appear that the tilting mirrors produce a phase image on the wafer. Phase images are known to produce artifacts when scanned through the focus range. In this case, however, the small size of the mirrors provide a high spatial frequency to the phase information. Accordingly, practically all of the phase information is removed by the finite aperture 110 of the projection lens 109-111. (The finite aperture may also be referred to as a Fourier stop.) The result is an image in the wafer plane that is purely amplitude-modulated and therefore behaves in the same manner as an image from a reticle. In particular, since the rows of mirrors on the SLM tilt in alternating directions, there are no telecentric effects (i.e. lateral movement of lines through focus).

In modern bitmap-based mask-writers, the grid produced by the pixels is subdivided by gray-scaling. While not necessarily intuitive, it has been proven by numerous simulations and in practice by the SIGMA mask-writers that the diffractive micro-mirrors can be driven to produce a similar virtual grid function. The rasterizer outputs 64 levels of pixel values, depending on the area of the pixel covered by the feature to be printed, and the pixel values are converted into mirror tilt angles. The resulting virtual address grid is 30/64 nm in a single pass. With two passes the grid can be further subdivided to 30/128 nm=0.23 nm. This is small enough to make the system truly "gridless". Any input grid, be it 1.0, 1.25, 0.5, or 0.25 is rounded to the closest 0.23 nm. The max round-off error is 0.12 nm and the round-off errors are equally distributed. The resulting contribution to CD uniformity is a negligible 0.28 mm (3σ). Additionally, there are no observable grid snapping or aliasing effects.

The SLM-based image generation system replaces the reticle stage and reticle handler, along with associated metrology, electronics, and software. By synchronizing the loading of image data into the mirror arrays with the firing of laser pulses and wafer stage positioning, the pattern is printed on the wafer. By definition, the mirror array forms a fixed projected grid. Gray scaling is used to control both line width and line placement in sub-nanometer increments. This is achieved by placing the pixel in an intermediate state between "off" and "on" such that only part of the light is transmitted. To obtain good pattern fidelity and placement, the size of the pixel projected on the wafer should be approximately half the minimum CD. With 8 μm×8 μm pixels, the projector system de-magnifies the pixels by a factor of 200 to 300 times. The ultimate stamp size is thus limited by the maximum size of the lens elements close to the SLMs.

In order to achieve high throughput, the OML tool delivers full dose (i.e. energy per unit area) in only 2 pulses per stamp, as compared to 30-50 pulses in a conventional lithography scanner. Due to the small field size, the actual laser power is significantly lower. The data path can accomplish partial compensation for pulse-to-pulse variations, but still a laser with very good pulse-to-pulse energy stability helps meet dose control requirements.

Figure 2:
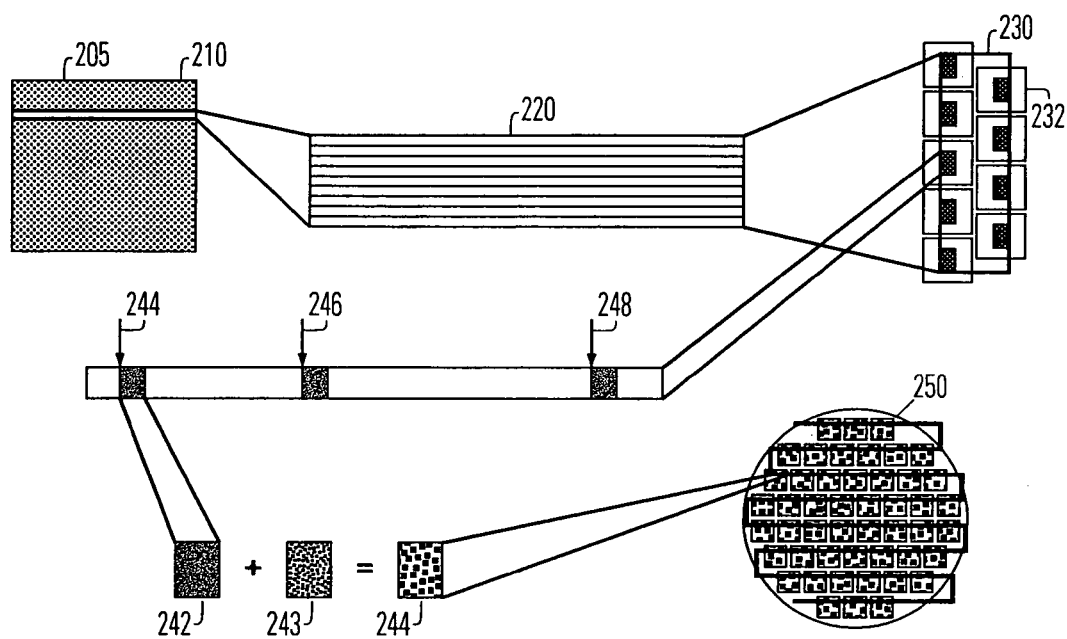
FIG. 2 depicts the wafer is scanning at a constant velocity, short pulse lengths utilized in OML, with micro-steps from stamp to stamp.

While the wafer is scanning at a constant velocity, short pulse lengths are utilized in OML, making it more analogous to a system that micro-steps from stamp to stamp, as shown in FIG. 2. Stitching quality is therefore a critical performance issue, as both layer-to-layer overlay and within-layer alignment is extremely important. In the figure, pattern data for a die 205 is broken into stripes 210. A strip can be printed by an array of SLM's. The stripe is broken into micro-stripes 220 that correspond to printing by an SLM 232 in the array. The SLMs in the array 230 are loaded with data. The loading of an SLM 232 to produce a micro-shot 242, 246, 248 and a micro-stripe 220 begins with idealized pattern data 242. Calibrations, corrections and overlap adjustments are applied 243, producing data 244 to be sent to the SLM. The wafer is printed by controlling the sequence 250 of stamps and stripes across all SLMs in the array.

OML Subsystems Overview

Design decisions for OML correlate to throughput and CD uniformity. Throughput is determined by pixel size, number of pixels in one flash, and SLM frame rate, whereas the resolution is affected primarily by the pixel size and the optical design. Secondary parameters include the number of pixels per SLM, stage speed, data flow, etc.

Integrating an Optical Maskless Scanner on an existing ASML TWINSCAN platform means adapting several subsystems. Most notably, the reticle stage (including interferometry) and the reticle handler are removed from the system. These reticle modules are replaced with a Multi-SLM Array (MSA) module, consisting of multiple SLMs in a pre-defined pattern, along with all of the necessary data-path drive electronics and pattern processing software required to support the use of the SLMs to dynamically generate the required mask pattern. In addition, the laser, illumination system, and projection optics are specifically designed to meet the unique optical requirements of OML.

Accordingly, changes in the form and functionality of the main systems will impact other sub-systems, though generally to a lesser degree. For example, dose control must change because the exposure of the resist is done in only two laser shots and synchronization must be adapted to coordinate the activity of the SLMs in place of the reticle stage.

FIG. 3 outlines the system architecture and the degree of variation between major modules to the system and a conventional ASML TWINSCAN, distinguishing those items that are unique to the OML tool as well as items requiring functional and/or structural changes. A large portion of the architecture can be reused, with major changes to the image generating system and the optical path. The image generation 310 system is adapted from the SIGMA product. A multi-SLM array is entirely new, as the SIGMA product has used a single SLM. Functional and/or structural changes to the SIGMA product are indicated for the remaining subsystems of Image Generation.

Image Generation Subsystem

The image generation subsystem defines the core function of the Optical Maskless Scanner and consists of the SLM unit, driving electronics and data path. Architecturally, it is very similar to the image generation subsystem in the SIGMA mask-writers, though extended to accommodate much higher throughputs as well as incorporating improvements for resulting image fidelity and overlay. The SLM is a VLSI MOEM array of reflective, tilting mirrors, each of which can modulate the reflected intensity and induce phase changes such that, in combination, a geometrical 2D pattern such as a circuit or portion thereof is produced. Since the size of each mirror is several microns, it is necessary to use a strongly de-magnifying projector to reduce the size of the pixels on the wafer in order to print the features of interest. Specifications for one embodiment of the SLM and the drive electronics are provided in the table below.

| Parameter | Specification |
| --- | --- |
| Mirror Size | 8 μm × 8 μm |
| Array Size | 2048 × 5120 |
| Frame Rate | ≧4 kHz |
| Drive Voltage | <10 V |
| Number of Analog Levels (calibrated) | 64 |

While ideally one would pack the entire object plane of the PO with a single massive array of mirrors, such devices are beyond current MEMS technology. Thus, it is necessary to use an array of multiple SLMs in parallel to provide the number of pixels needed to achieve the desired throughput. The pixels from different SLMs in the Multi-SLM Array (MSA) are stitched together to form a cohesive picture on the wafer plane using a combination of motion control and gray-scaling techniques. The wafer stage moves continuously, stitching together the distinct SLM images while printing with a set of overlapping pixels along the edges between the SLMs. The layout is structured to allow complete transfer of the pattern with two overlapping laser pulses. Displacing the SLM stamps and pixel grids between the pulses serves to average residual grid and SLM artifacts, thereby reducing any appearance of grid and SLM chip structure.

Figure 4:
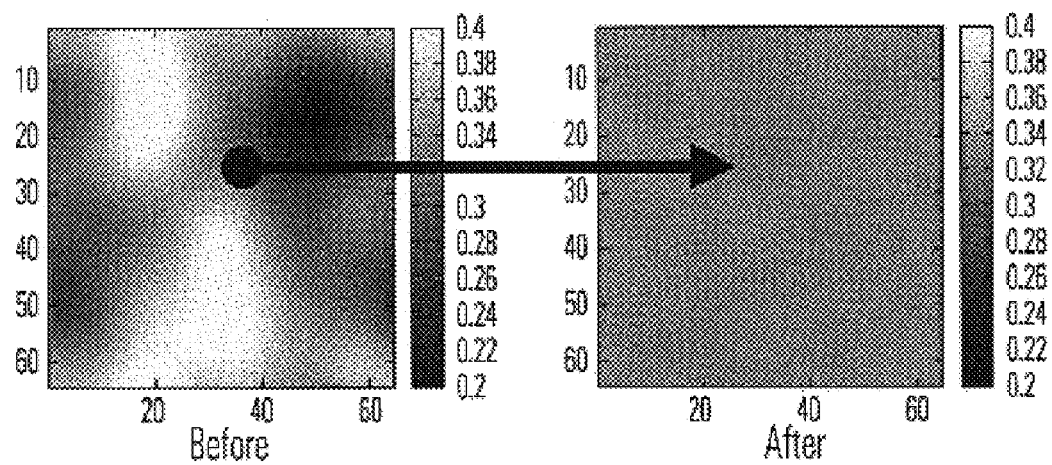
FIG. 4 shows the results of calibration of mirrors.

The requirements on mirror to mirror uniformity is higher than can be achieved by tight manufacturing tolerances alone. Slight differences in each mirror result from varying film thickness, varying CDs in the flexure hinges, and so forth. Each pixel's response in displacement angle to induced voltage must be calibrated and corrected for with a calibration map that is applied to the bitmap data on a shot-by-shot basis. Gray-scaling for stitching as well as compensation for any bad pixels are embedded in this map. The OML tool calibrates the SLMs in-situ in order to accommodate long-term drift of the SLM pixels. Due to the large volume of pixels and the fact that the projected images of the pixels is sub-resolution, calibration is achieved by looking at groups of pixels and making the group provide uniform intensity at varying intensity levels. FIG. 4 shows the results of calibration of mirrors in an SLM of a SIGMA 7100. These are aerial images in flat gray of an 8×8 array (64 pixels) of an SLM before and after calibration. The leveling effect of calibration is apparent.

Data Path

The data path, together with the analog driving electronics, delivers the data to the MSA with an anticipated data transfer rate of approximately 250 GPixels/sec. The steps for converting pattern data into SLM images to be printed are as follows:

Pattern Input: At the start of a run, the user will upload a mask file (e.g. GDSII or OASIS) into the Optical Maskless Scanner, containing all of the pattern for the die to be printed. The rasterizer is optimized to produce an optical image from the SLM that is as close as possible to the image on a real reticle, with OPC corrections in the input data stream. Even sub-resolution OPC features are accurately represented by the SLM, and the image produced on the wafer is virtually identical to the image from a reticle. Alternatively, OPC corrections can be introduced to the data stream in real time.

Fracturing: Prior to the run, the pattern data is segmented into fragments corresponding to the Multi-SLM Array layout, and sequenced via the writing and stitching strategies to reproduce the pattern on the wafer. This data is fractured to produce a small overlapping border area on each side to allow the fractured images to be stitched during exposure.

Rasterization: During the run, the appropriate image segment for each SLM is converted into a bitmap of pixel values representing the image. The rasterization step includes both processing an idealized image on the pixel grid while maintaining the appropriate feature size and placement, as well as application of corrections and individual mirror calibrations to ensure proper image fidelity on the physical device.

Data Write: The rasterized pattern for each SLM is transmitted to the SLM in synchronization with the laser and the wafer stage, so that the pattern is established on the SLM during the laser flash of the appropriate pulse.

Given the extremely high data flow rates and complex patterns being reproduced, data integrity is an extremely important aspect of the data path. During software development, regression tests can be used to compare against the output of earlier versions.

The second aspect of data integrity is the avoidance of bit-errors in storage and transmission of large data volumes. This is done by standard methods, and since most of the data path works in an asynchronous mode, errors are detected before they can do any damage. In most cases, correct data can either be re-transmitted or regenerated. The system flags all errors, and can be configured to specify the action to be taken on specific types of errors, (e.g. abort the job, abort the die, automatically correct the die, or mark the die as potentially broken in a log file.)

Finally, the high capacity of the data path is achieved through the use of a highly parallel electronic architecture. The downside of parallel systems is the statistically higher risk of malfunctioning modules. Special attention is therefore given to module diagnostics, so that any hardware problems are detected early. With these principles and precautions, the data path will not contribute significantly to yield losses.

Illumination

The illumination system (320 in FIG. 3) for direct writing in a scanner is very different than for a scanner and significantly changed from the illumination system used in SIGMA. Since only a small portion of the total optical field has active pixels, the illumination system must be designed to only illuminate the active pixel areas in the object field. Adaptation to two-pulse printing impacts laser requirements for OML. The power requirements are approximately $1/10$ of a conventional scanner, primarily because of the large reduction in field size and a comparatively low throughput. The repetition rate of the laser matched to the refresh rate of the SLMs. A 4 kHz laser can be used. Pulse-to-pulse stability of 1% $3\sigma$ is helpful, which is roughly 10× better than conventional lithographic lasers that use pulse averaging of 30-50 pulses for dose uniformity. Alternatively, additional pulses can be used to deliver the dose with more averaging, and can be set to correct dose errors from previous passes. While these alternatives can improve dose control, they reduce throughput.

Laser pulse timing error (i.e. jitter) also can impact overlay performance. In a conventional scanner, the wafer and reticle stages run synchronized, so laser timing and pulse length do not significantly influence pattern placement. In Optical Maskless Lithography, as the SLM array is "stationary" during exposure, i.e. the image is scanning at the speed of the wafer stage. For wafer stage speeds on the order of 300 mm/sec, a 30 nsec laser timing jitter results in a 9 nm placement error, which is unacceptable for some applications. The duration of the pulse will result in a smearing of the image, though this smear effect is constant for a constant wafer stage speed and is therefore not a concern for overlay. Furthermore, the impact of smear from a relatively short pulse duration on X/Y asymmetry is easily corrected in the data path.

The table below summarizes desired laser characteristics.

| Parameter | Specification |
| --- | --- |
| Wavelength | 193.368 nm |
| Bandwidth | 10 pm |
| Static Range | 193.33-193.45 nm |
| Rep Rate (max) | ≧4 kHz |
| Power | ≧5 W |
| Pulse Energy | ≦10 mJ |
| Pulse Length | ≦20 ns |
| Pulse Energy Stability | <1% $3\sigma$ |
| Pulse Jitter | <5 nsec |

Dose measurements use a sensor in the illumination system to track the intensity of each pulse. Power tracking with such a detector is useful in an OML scanner, averaging over just a few pulses, as dropped pulses or large pulse-to-pulse variability can have a significant impact on tool performance. Dropped pulses are easily detectable—by tying the detector into synchronization such that each sync pulse has a corresponding energy reading, tool software can readily confirm valid detector readings for each pulse. The 193 nm illumination energy detectors used in ASML scanners track energy per pulse. These detectors are calibrated between wafers to an energy detector on the wafer stage, which in turn is referenced periodically to a global standard with a removable master detector.

The illumination optical design concept is based upon a multi-array design providing pupil and field definition, along with multiple condensers to provide illumination homogeneity. This concept allows OML to generate the same illumination profiles and sigma settings as conventional scanners. The advantages of the multi-SLM array design may include:

Field Definition—This design allows for a field-defining element (FDE), so that only the active mirror portions of the SLM in the Multi-SLM Array are illuminated. This is needed to improve the stray light characteristics of the system and to allow for lower power, since only a small portion of the optical field area for the Multi-SLM Array contains active pixels.

Pupil Polarization Support—Primarily for extendibility to future lithography generations, the multi-SLM array design allows for polarization of the pupil for enhancing certain feature types in ultra high-NA systems.

Projection Optics

Among the projection optics 320 subsystems, Calibration Optics & Metrology are very different from the subsystems used in SIGMA. A catadioptric design form with a beamsplitting cube 526 has been identified as a useful design for OML, due to its optical suitability for the 65 nm node as well as potential extendibility to next-generation requirements. This design reduces the amount of glass used, and does not require significant quantities of CaF2. The preliminary optical design for the projection optics is shown in FIG. 5. The illumination system 520, multi-SLM array 512, projection optics 530 and wafer stage 540 are illustrated.

Multi-SLM Array

The mechanical mounting and the electrical and optical packaging of each SLM are part of the design of the Multi-SLM Array. Since accurate control of the spacing between the active portions of the SLMs is needed to achieve proper stitching between the images of individual SLMs, the packaging must be designed so as to accommodate the desired SLM layouts.

The extension of SLM technology to print directly on wafers presents unique challenges. The system specification on throughput, along with the requirement to provide two-pulse printing, drive the need for ~60 MPixels per laser flash to be printed. At 4 kHz operation, assuming each SLM consists of an array of 2048×5120 active mirrors, 6 SLMs are required in the object plane of the projection optics. Limits on the maximum feasible lens diameter in front of the SLM, along with packaging and spacing requirements to ensure proper stitching of discrete SLM images while printing, impact the layout of the SLMs in the optical field.

Configuring the multiple SLMs to satisfy optical, packaging and servicing issues presents optical, electrical, and mechanical tradeoffs. In addition, the electrical design supports data transfer rates in excess of 250 GPixels/sec in order to write data to each of the SLMs at a 4 kHz refresh rate. Since the current SLM design does not contain on-board digital/analog converters, each SLM is driven with analog signals. Accordingly, each SLM needs ~1,000 DACs and amplifiers next to the chip and ~2000 coax electrical wires to drive the amplifiers. The sheer volume of connections as well as the required data rates raises heat dissipation and reliability issues.

Imaging Performance Simulations

Sophisticated simulation packages, such as Prolith 1.7 by KLA Tencor, Solid-C v. 6.2 from Sigma-C, and LithoCruiser by ASML MaskTools, are commercially available for conducting performance simulations for conventional lithography. These tools currently incorporate neither a rasterization module nor the capability to handle SLM imaging properties of OML. For the analysis of the imaging performance the commercial simulators have been driven from shells in Matlab providing the missing functions. Development of a more user-friendly simulation infrastructure is desirable.

An OML Imaging Performance Simulator with Prolith as the core aerial image analysis engine hold promise. In conjunction with this, custom Matlab scripts provide the necessary computations to rasterize arbitrary 2-D patterns (e.g. lines, contacts, SRAM cells, etc.) into an array of pixel tilts and sequence the rasterized image through pixel grid and through pulses, with each grid/pulse sequence analyzed by the core Prolith engine. A tilted mirror is divided into typically 10 or more areas, each one of them flat and with a phase that is the average phase over the corresponding area of a tilting mirror. It has been found that seven areas or more give a good approximation of a flat mirror with a linearly varying phase. For this work the mirrors have been assumed to be ideal, i.e. flat with uniform 100% reflectivity, no reflection from the slits between them, and actuated to exactly the deflection determined by the data path. Each grid/pulse sequence is then recombined and analyzed to predict the final performance of that pattern under the given illumination and PO conditions. The simulations are intended to be realistic and have been done with high-NA, vector unpolarized light. Most results are based on aerial image simulations. Where developed resist profiles are shown, the resist model used is a best estimation model for TOK6063; which has been used for other work at ASML's Technology Development Center in Tempe. The optics has been assumed to be ideal: no aberrations and no errors in the illuminator settings. Preliminary results from the OML Imaging Performance Simulator show good correlation in CD, contrast, and NILS when compared to an analogous 6% attenuating phase-shift mask (Att-PSM).

FIG. 6 shows an example of a mirror tilt configuration to produce a 60 nm CD line pattern 610 with scatter bar OPC 622, 624. The applied algorithm translates the line 610 and the scatter bars 622, 624 into mirror tilt settings. The figure depicts two rows 632, 634 of mirrors 636. Gray shades depict local phase change as a result of the mirror tilts.

The mirror tilts depend on the placement of features with respect to the SLM pixel grid. In the second pass, the feature placement with respect to the grid changes. The sum of the two passes is more symmetrical than apparent from FIG. 7. The figure shows the resulting common process window in resist for 60 nm lines at 130, 200, 400, 600 and 1200 nm pitch. The exposure latitude (EL) depends on the depth of focus (DOF), with a 9.1 percent exposure latitude at best focus. An 8 percent exposure latitude corresponds to an 0.085 micron DOF.

FIG. 8 shows two aerial images of 60 nm contact holes at 130 nm pitch at two different positions with respect to the projected SLM pixel grid. The top picture depicts zero features in a first grid position and the bottom picture depicts a 20 nm shift with respect to the mirror grid. The images were produced with a Diagonal Quasar (0.97/08, 15°) 0.93 NA. As can be concluded from these images, pixel grid effects can be reduced by applying the digital filter and rasterizing algorithm described below.

Evolution of the Rasterizing Algorithm

Rasterization for a non-coherent imaging system is in principle simple: overlay the desired pattern with the pixel grid and assign to each pixel a gray value that is the fraction of the pixel that is covered by the feature (assumed to be an exposed feature). This is a so-called area bitmap since every pixel value represents an area. This rasterization is useful in laser-scanning pattern generators (PG) and also particle-beam PGs. If the pixels are not small compared to the diffraction-limited spot of the optical system, a non-linear correction may need to be applied. The non-linear function may also correct for non-linearities in the modulators, such as an acousto-optic modulator.

However, this approach does not print correctly for partially coherent light. The area bitmap has to be transformed by a non-linear function to an intensity bitmap that is the desired intensity from the array of modulators. The non-linear function can be computed from first principles, or it can be measured in a dedicated experiment. The non-linear function is called the illumination table. With rasterization using the illumination table, the SLM system prints correct CDs for patterns down to approximately k1=0.5. This works for a mask writer, but for a maskless tool printing lines down to k1 values around 0.2, the illumination table approach is inadequate.

A closer analysis shows that, even though line widths are rendered correctly by the illumination table method, the image log-slope is dependent on the position of the edges relative to the grid. At edges that fall on grid positions, so that one pixel is fully on and the one on the other side of the edge is fully off, the SLM prints extremely close to an ideal amplitude mask. But if the edge is displaced by half a pixel the edge falls between grid positions and there will be an intermediate pixel between clear and dark that has an intermediate value. This acts as a low-pass filter. The result is that the image is lowpass filtered in off-grid positions and not on grid. The varying effect across the grid is compensated by double or quadruple pass printing, with a general loss of edge acuity in the order of ten percent. This may be acceptable for a mask writer writing four passes, but for maskless lithography or only two passes, unwanted artifacts will result. In wafer lithography, features are printed close to the resolution limit and the CD linearity may be compromised. The features are nearly fading away and are brought back by the high contrast of the resist process. In this imaging regime, the image log-slope varying with grid causes undesired CD variations. CD vs. grid can be calibrated for one pitch, but will fail for other pitches or feature types. A more elaborate rasterization is needed.

FIG. 9 depicts one-dimensional digital filtering of the bitmap. The closest row 910 is the raw rasterized bitmap. Behind it 920, a filtered bitmap to enhance the off-grid edges is shown. The second from the back 930 is a filter that enhances all edges, and the row in the back 940 is the combination of rows 920 and 930: a filter that removes the grid and enhances all edges simultaneously. The negative values depicted with black shading (e.g., 943) do not exist in normal image processing. Here, they are actuated as mirror tilts that create negative complex amplitude.

The solution to the variations through grid that has been developed is the grid filter, a digital filter that operates on the area bitmap. Digital filtering can do many things, but the function is first and foremost to remove the visibility of the grid in the image. To do so, a derivating kernel is convolved with the area bitmap, but only for neighbors to a pixel with an intermediate pixel value, a "gray" pixel (e.g., 912). The description as a convolution should be taken in an approximate sense. The neighbor that is closest on the dark side is made darker 923, and the one on the clear side is made brighter 921. How much darker and brighter depends not only on the value of the intermediate pixel, but also on the illumination mode. A number of parameters are computed for the actual optical settings. These parameters are global and readily computed. Alternatively to using nearest neighbors, but it is possible to extend the filter to second-nearest neighbors or to use even larger kernels. Tuning the algorithm changes the trade-off between pixel size and image quality. Features below two pixels can be printed with good fidelity. Resolution is limited by the optical system. When the parameters are tuned, the edge acuity of edges on grid or off grid is the same. The algorithm appears to be surprisingly insensitive to the type of feature. One setting appears to work approximately right for most features, something that can be explained by the fact that the filter only adds a minor correction to the pattern.

FIGS. 21a-f graph look-up tables (LUTs) calculated to implement the digital filtering. The LUTs are calculated for particular optical settings (wavelength, illuminator, numerical aperture), pixel properties (size and the amount of "negative black" used) and the number of neighbors included in the filter. They are individual for each pixel and describe the change in gray level of each pixel as a function of the gray level of the intermediate pixel. It is also possible to combine the bright and the dark pixels LUTs to one single LUT where the entry is not the gray pixel value, but the difference in gray value between the pixel to be compensated and the edge pixel. For instance, an LUT may be calculated for a wavelength of 193 nm, a numerical aperture of 0.93, an illuminator sigma of 0.6, 0.8 or 0.99, a pixel size of 30 nm and a reflectivity in dark of phase shifted areas of 0, −6% (corresponding to −0.245 amplitude) or −1 (corresponding to 180 degrees phase-shifted). LUT 21a was used in calculations of FIGS. 11 & 12. LUT 21b was used in calculations of FIG. 19. LUT 21c was used in calculations of FIG. 13. LUTS 21d-21f depict cases in which the value of the gray, dark or bright pixel is held constant and the neighboring pixels are adjusted.

The LUTs are calculated by comparing the Fourier transform of an one-dimensional edge expressed with white, gray, and black SLM mirrors and the very same edge expressed with an ideal reticle/mask. The difference in the Fourier transform is minimized by allowing the gray value of some pixels in the vicinity of the edge to vary. The number of pixels included in the minimization will influence the shape of the LUT curves. The difference in Fourier transform is minimized for all spatial frequencies up to NA/lambda*(1+sigma), where sigma is the partial coherence factor in the illuminator. This is repeated when the edge is moved step-by-step over one pixel, beginning aligned to the pixel grid then passing over the whole pixel until it is again aligned to the grid. The edge position corresponds to an area coverage value (between 0 and 1), which is the edge pixel gray value. In the case of non-zero transmission in the dark areas, e.g. 6% phase-shifting, the gray value used as an entry to the LUTs is simply the area coverage (between 0 and 1) linearly scaled to the amplitude reflectivity range (between −sqrt(0.06) to 1). The adjustment ranges of all pixels are increased with increasing sigma, increasing NA, increasing pixel size, increasing transmission in the shifter/dark areas, and decreasing wavelength.

FIGS. 22a-b illustrate an embodiment of an off-grid correction filter. This off-grid filter operates during rasterization on the area bitmap and detects and raises gray pixels and lowers dark pixel neighbours to negative black. The pixel values are changed with two look-up tables, pre-computed before exposure, one for the gray pixel and one for the dark pixel. FIG. 22a, to the left, illustrates an uncompensated edge including a grey pixel P1, a dark pixel P2 and a light pixel. The uncompensated gray value on pixel P1, determines the compensated gray values P1* and P2*, according to: P1*=LUT1 (P1) and P2*=LUT2(P1), where LUT1 and LUT2 are two different look-up tables. After compensation, in FIG. 22b, the grey level of compensated grey pixel P1* has increased and the grey level of compensated dark pixel P2* has dropped below grey level 0.

In this embodiment, the LUTs are calculated with an infinite edge moving over one pixel in n steps, for instance, using the MATLAB linspace function on an equivalent. For each nominal edge position (corresponding to an area coverage), the position and Image Log Slope at a reference level is compared with when edge is on grid. A reference level is determined for pattern on grid. The LUTs are calculated iteratively. Initial values for the LUTs are:

LUT1(1:n,1)=linspace(0,1,n)
LUT1(1:n,2)=linspace(0,1,n)
LUT2(1:n,1)=linspace(0,1,n)
LUT2(1:n,2)=a*x^2−a*x, x=linspace(0,1,n), where a=0.217*4, i.e maximum negative black*4, or something else The LUTs are applied to pixel P1 and P2, according to:
P1*=LUT1(P1,2)
P2*=LUT2(P1,2)

An aerial image is then calculated. Correction terms, at each n steps, are calculated for position and ILS as:
Corr_pos=nominal position/real_position
Corr_ILS=ILS_reference/ILS_real Either LUT1 or LUT2 is updated, depending on if position or ILS is optimized
LUT1_new(P1,2)=LUT1(P1,2)*Corr_pos
LUT2_new(P1,2)=LUT2(P1,2)*Corr_ILS If one converge criteria is fulfilled, repeat from applying the LUT to pixels P1 and P2 and optimize with respect to the other until both criteria are fulfilled.

FIG. 23 illustrates resulting LUT functions. LUT1 for P1 is the top line in the graph. LUT2, for P2, almost reaches down to maximum negative black amplitude attainable by a tilting micromirror.

Figure 24A:
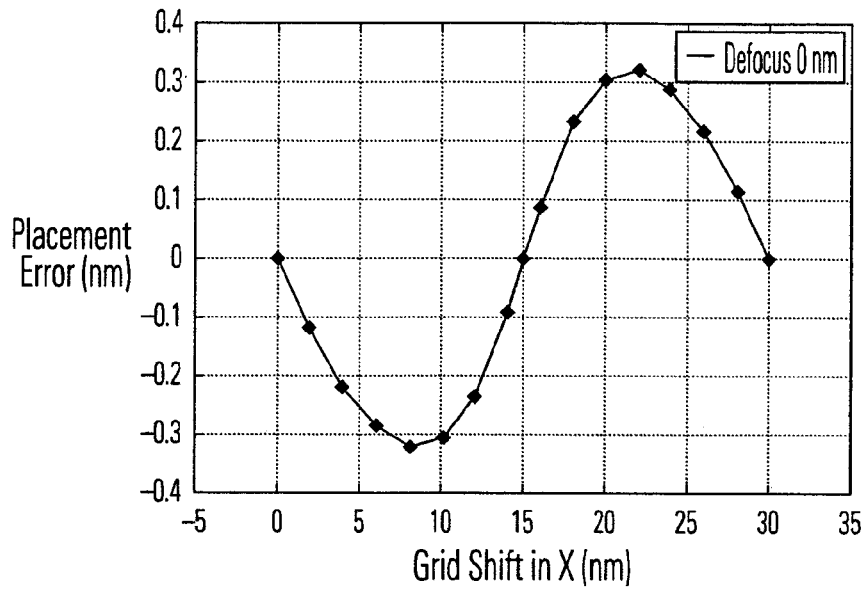
Figure 24B:
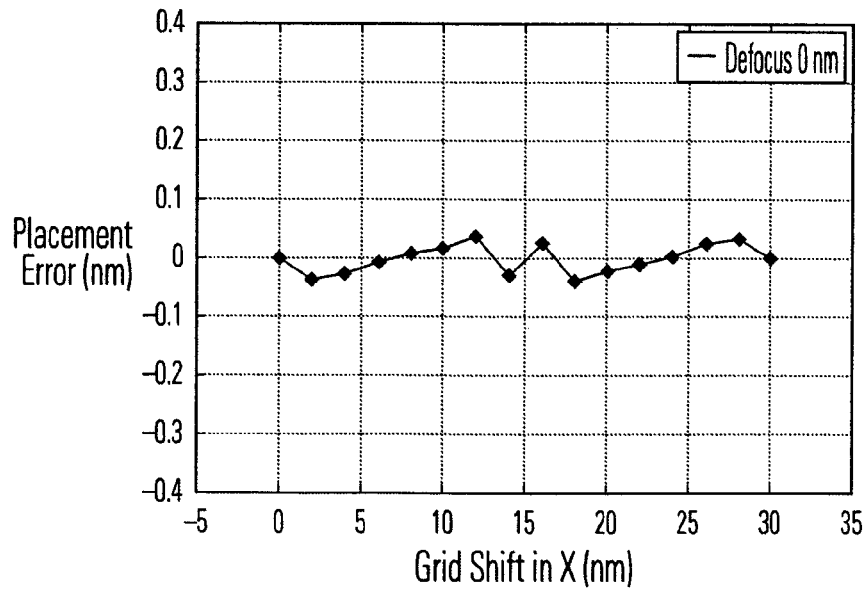
Figure 25A:
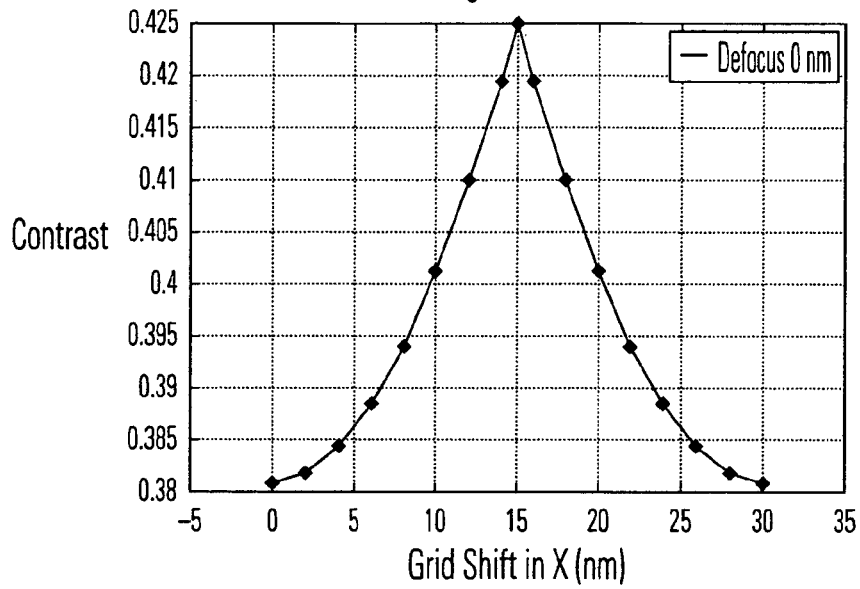
Figure 25B:
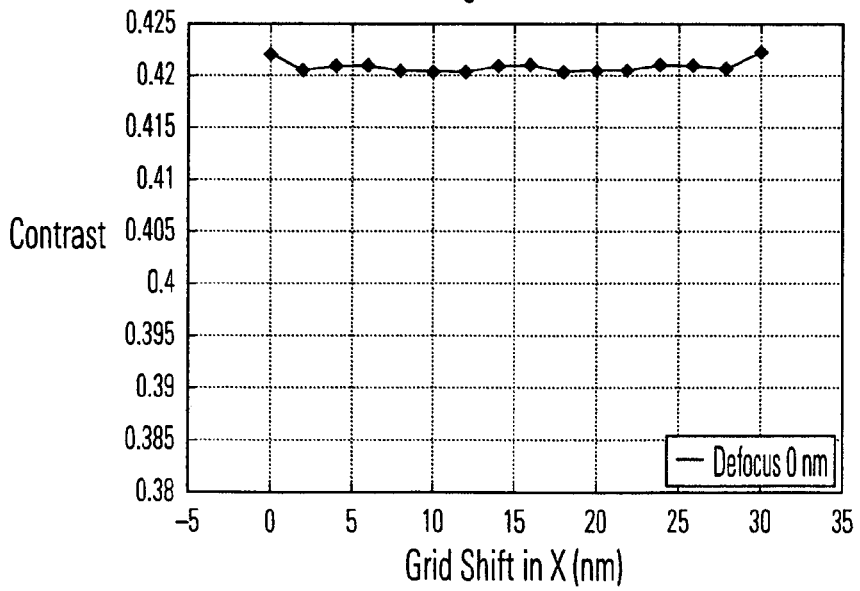
Figure 26A:
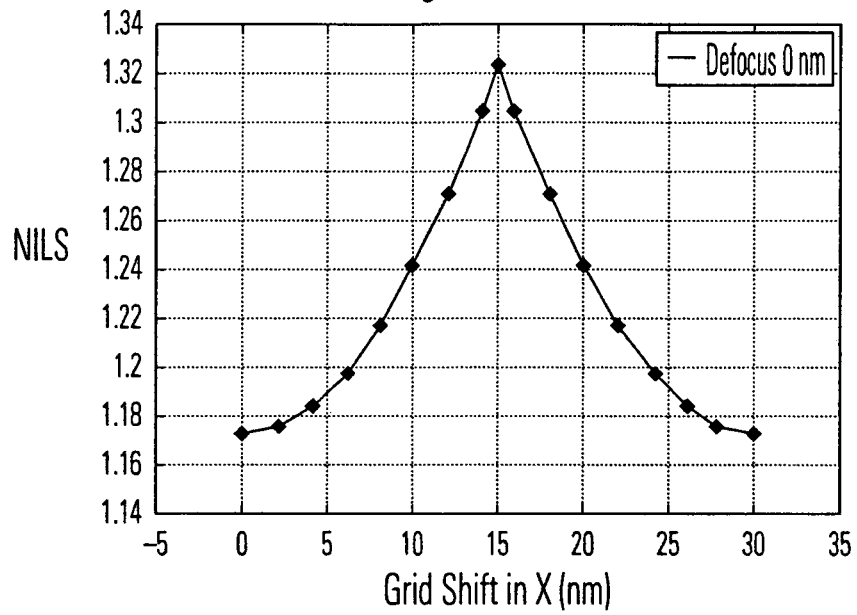
Figure 26B:
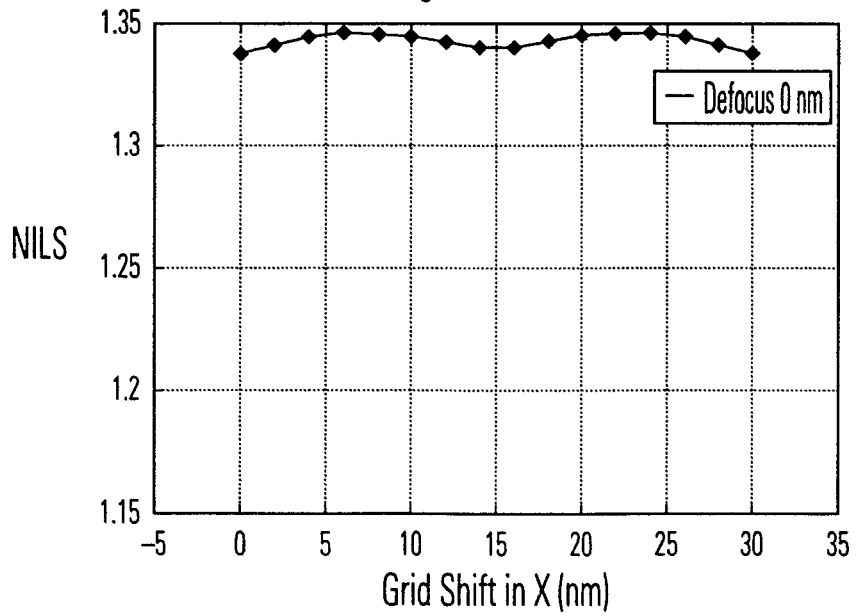

Calculations of the improvement due to this embodiment of the off-grid filter are illustrated in FIGS. 24a-b, 25a-b and 26a-b. Some of the parameters used to calculate these results were: 90 nm dense L/S; annular illumination 0.7/0.9; 2 nm mesh grid; 30 nm pixel size; 13 pupil mesh points; and NA 0.92925925925926. FIG. 24a-b illustrates placement error versus grid shift. In FIG. 24a, the smallest placement error of zero corresponds to a grid shift of 0, 15 or 30 nm, using an illumination table LUT. With the off-grid correction filter of this embodiment, there is very little placement error, regardless of the grid shift, through the range of 0 to 30 nm. In FIG. 25a-b, the contrast attained between opposing sides of the intended boundary between dark and light is again graphed against grid shift for the illumination table LUT (25a) and the off-grid correction filter of this embodiment (25b). Finally, normalized image log slope is plotted against grid shift for the illumination table LUT (26a) and the off-grid correction filter of this embodiment (26b). Those of skill in the art will understand that normalized image log slope is normalized to feature size and tends to be proportional to exposure latitude. Varying the parameters to 60 nm dense L/S and 15 pupil mesh points changes the shapes of some of the curves in these figures, but generally confirms the performance of this embodiment of the off-grid filter.

Operation of another embodiment is illustrated in FIGS. 27a-b. This version of the off-grid filter also operates directly on the area bitmap and replaces the illimunation table LUT. During the operation, edges are detected, and the edge pixel and the two neighbouring pixels are modified. The pixel values are changed with three look-up tables, one for each pixel. The look-up tables are pre-computed before exposure. In FIG. 27a-b, P1 (grey pixel), P2 (dark pixel), and P3 (light pixel) are graphed against their area bitmap gray levels, i.e. area coverage. The uncompensated gray value on pixel 1, P1, determines the compensated gray values P1*, P2, and P3*, according to:
P1*=LUT1(P1)
P2*=LUT2(P1)
P3*=LUT3(P1)
where LUT1, LUT2, and LUT3 are three different look-up tables.

The LUTs are calculated by substantially minimizing the difference in the Fourier transform (FT) from the SLM and a perfect binary or phase-shifting mask over the projection optics pupil.

The edge offset correction filter, which may substantially minimize the difference in the Fourier transform from projecting radiation from the aligned pixels of the SLM and a perfect binary mask or phase shifting mask over the projection optics pupil may be performed using one two, three or more pixels.

FIG. 28a, to the left, illustrates an SLM with a feature with a width w*(1+gl), were w is the pixel width and gl is in the range [0, 1]. The pixels are modeled with an amplitude transmission that can have negative values. a, b, and c are parameters used to minimize the diffraction pattern difference compared to the ideal case. The complementary FIG. 28b illustrates an ideal pattern from a binary mask. The feature has the same width as in the SLM case, w*(1+gl). The real and imaginary part of the difference in the FT, FT_SLM(fx,a,b,c,gl)−FT_ideal(fx,gl), is for each value of gl, minimized for all fx in the range [−NA(1+sigma)/lambda, NA(1+sigma)/lambda]. NA is the numerical aperture of the projection optics and sigma is the degree of coherence in the illumination.

$$FT\_SLM = w * \text{sinc}(w * fx) *$$
$$(1 + a + (gl + b) * \exp(-i * 2 * \pi * w * fx) + c * \exp(-i * 4 * \pi * w * fx))$$
$$FT\_ideal = w * \text{sinc}(w * fx) * + gl * w * \sin$$
$$c(gl * w * fx) * \exp(-i * \pi * w * fx)(1 + gl))$$
$$F\_min = (FT\_SLM - FT\_ideal)/(w * \text{sinc}(w * fx))$$
$$= a + b * \exp(-i * 2 * \pi * w * fx) +$$
$$c * \exp(-i * 4 * \pi * w * fx) +$$
$$gl * \exp(-i * 2 * \pi * w * fx) -$$
$$gl * \text{sinc}(gl * w * fx)/\text{sinc}(w * fx) *$$
$$\exp(-i * \pi * w * fx)(1 + gl))$$

The equation system above can be re-written in a matrix form, A*x=h. The over-determined linear equation system A(fx)*[a, b, c]=h(fx,gl), is solved in a least square sense.

In FIG. 29, the resulting calculations are graphed for lambda=193 nm, w=30 nm, NA=0.93, sigma=0.96. The top line depicts LUT3=a. The bottom line depicts LUT2=c. The middle line depicts LUT1=b.

In FIG. 30, application of this embodiment of the grid filter has been performed on dense lines and spaces, with half pitch 60 nm. The result is a smaller CD range, a smaller PE range, higher contrast, a smaller contrast range, a higher NILS and a smaller NILS range than with the illumination table LUT.

This embodiment of the grid filter can be extended to include not only binary masks, but also phase-shifting masks, including weak and strong phase-shifting (CPL, which is sometimes called chromeless phase lithography, even though it is presently used with some areas of chrome on the mask). FIGS. 31 and 32 illustrate in the same way as FIGS. 27 and 28, an SLM and an ideal pattern from a reference reticle both with a feature with a width w*(1+gl), where w is the pixel width, gl is in the range [0,1], and gld is equal to gl*(1−d)+d, i.e. gld is equal to gl scaled to the range [d, 1]. In this case, the transmission in the area outside of the feature is not zero, but instead the amplitude has a magnitude d, which can have any value from −1 up to any value lower than the transmission in the bright areas. Hence, it can be zero as in a binary mask, between −1 and zero as in phase-shifting masks, or −1 as in CPL. The corresponding equations describing the Fourier transforms of the SLM, the perfect phase-shifting reticle, and the difference to be minimized are in this case:

$$FT\_SLM = w * \text{sinc}(w * fx) * (1 + a - d + (gld + b - d) * \exp(-i * 2 * \pi * w * fx) +$$
$$c * \exp(-i * 4 * \pi * w * fx)) + d * \delta(fx)$$

$$FT\_ideal = (1 - d) * w * \text{sinc}(w * fx) + (1 - d) * gl * w * \text{sinc}$$
$$(gl * w * fx) * \exp(-i * \pi * w * fx)(1 + gl)) + d * \delta(fx)$$

$$F\_min = (FT\_SLM - FT\_ideal) / (w * \text{sinc}(w * fx)$$
$$= a + b * \exp(-i * 2 * \pi * w * fx) +$$
$$c * \exp(-i * 4 * \pi * w * fx) +$$
$$(gld - d) * \exp(-i * 2 * \pi * w * fx) -$$
$$(1 - d) * gl * \text{sinc}(gl * w * fx) / \text{sinc}(w * fx) *$$
$$\exp(-i * \pi * w * fx)(1 + gl)),$$

where $\delta(fx)$ is the dirac delta function.

As mentioned previously, the equations above apply to binary, weak and strong phase-shifting (CPL). When the SLM and grid filter is used to mimic the performance of alternating aperture phase-shifting masks (AAPSM), the equations above cannot be applied directly. For AAPSM, the bright areas in the mask with opposite phase must be treated separately and the resulting pixel values are added together. The areas with zero phase can simply, together with the surrounding dark areas, be treated as from a binary mask and the corresponding settings should be used. The bright areas with 180 degree phase can, together with the surrounding dark areas, in the same way be treated as from a binary mask, but simply with a negative transmission. One of skill in the art will recognize that emulation of AAPS masks will involve setting mirrors to opposing phases, the mirrors separated by essentially dark mirrors, to emulate the dark areas separating areas of zero and 180 degree phase.

In FIG. 29, the resulting calculations are graphed for lambda=193 nm, w=30 nm, NA=0.93, sigma=0.96, and d=$-\sqrt{(0.06)}$=$-0.245$. The value of d corresponds to a 6% attenuated phase-shift mask. The top line depicts LUT3=a. The bottom line depicts LUT2=c. The middle line depicts LUT1=b. Note that the value of the uncompensated edge pixel, P1, is in the range [d, 1].

The Embedded Reticle

FIG. 10 shows the similar functions of a maskless tool 1030 and a mask writer 1010 and scanner 1020 in cascade. The image, which may appear trivial, should be taken in a literal sense. From the input side, the tool is a mask writer 1032. From the output tool, it is a scanner 1036. Those input and output interfaces are almost identical to those of the non-embedded machines.

The embedded mask writer 1032 converts data to produce an embedded reticle 1035, which is the image created by the SLM, not the SLM surface itself. Most of the OPC properties of the system originate from the optical projection and illumination system. To correct them, one analyzes the image within a range of 1 micron or better. Some additional OPC effects come from the mask 1015, most importantly from corner rounding, CD errors coupled to feature size, pitch and polarity, and to density effects in the mask process. Effects of the 3D electromagnetic boundary conditions in the real reticle may also effect printing. Clear areas appear smaller, the edges are polarizing and the transmission of thin lines is affected by EMF effects.

The SLM creates the same image as the mask, but because of the digital image and the large demagnification, it does not have the errors above. It has been shown that electromagnetic 3D effects do not come into play for mirrors larger than 2 microns. The characteristic effects that the SLM and data path have are coupled to the finite size of the grid and the mirrors. They are correctable by nearest-neighbor operations in the bitmap, as described above. In fact, the grid filter removes the pixel character of the image, which is its single most noticeable system characteristic, and gives a neutral conversion from data to SLM image.

FIGS. 11a-11b depict simulated aerial image of corners from reticles with corner radii 0, 40, 80, 160, 200, 240, 320 nm (dashed lines) and from an SLM at several grid locations (solid lines) with the grid filter applied. FIG. 11b is an enlarged section of FIG. 11a. The system output depicted in FIG. 11 reveals properties of the embedded reticle. The whole system is simulated including rasterization with mirrors and compared to the printing properties from a reticle with known characteristics. FIG. 11a shows a simulated corner on the wafer printed from a reticle with known corner radius and from an SLM. FIG. 11b shows a magnification of the corner. The dashed lines are corners made from reticles with varying corner radii, the solid ones are from the SLM with the pattern placed at different grid locations. It is shown that the SLM prints with a corner pullback that is within 1 nm from the ideal reticle, while a state-of-the-art physical reticle from a VSB mask writer with corner radius 80 nm has a pullback that is approximately 1 nm larger.

The embedded reticle 1035 of this system 1030 can be seen as an ideal representation of the input data with no grid effects and no significant resolution loss.

Off-axis Illumination

The illumination modes of a scanner can be duplicated in a maskless tool. Because of the difference in optical layout, with the maskless having a much smaller etendue, there are differences in how the off-axis illumination is implemented, but the same illumination pattern will give the same image properties, be it created by axicon, diffractive element or other means.

Generally speaking, the grid filter works best with conventional illumination. With conventional illumination, including non-extreme annular schemes, one setting seems to be right for all features. With extreme dipole illumination, the grid filter is slightly affected by pitch. With dipole the filter works perfectly only for a specific feature, and other features give CD errors through grid of 1 nm or less in a single pass. However, this is what the double-pass printing is designed to suppress, so there should be no measurable effects in the resist.

OPC Transparency

It is useful to match the maskless scanner OPC with a scanner using normal reticles, but is that possible? The following two examples indicate that a perfect transparency can be achieved, at least a transparency with a perfect reticle, as opposed to a real reticle.

Figure 12:
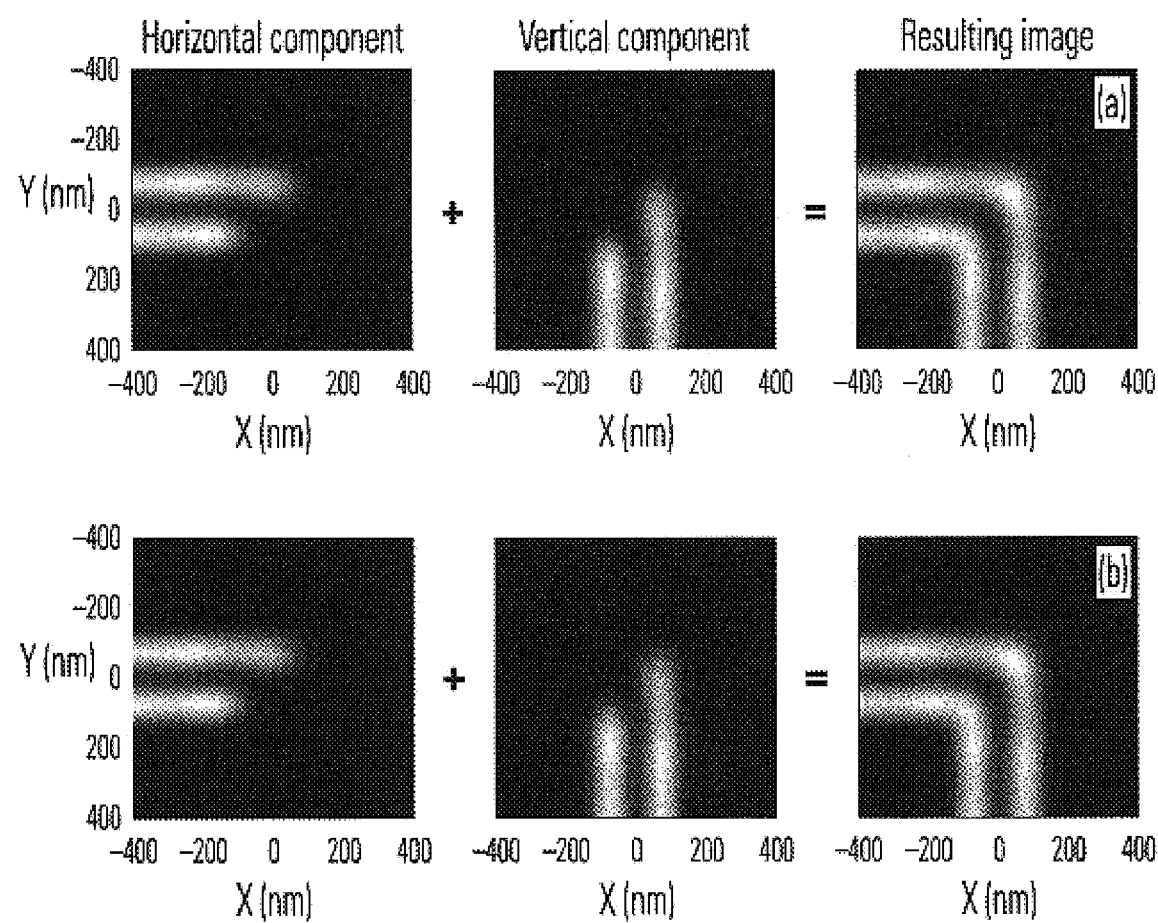

FIGS. 12a-12b depict aerial image simulations of double-dipole decomposition with reticle (a) and SLM (b). FIG. 12 shows the simulated double-dipole decomposition with extreme off-axis illumination. The data is decomposed naïvely with the intersection between the vertical and horizontal line segments duplicated to compensate for line-end shortening. FIG. 12a shows the individual images of horizontal and vertical components and the superposed image with a binary reticle. FIG. 12b shows the same components exposed with the SLM (tilting mirrors, single pass, grid filter). The images are indistinguishable. Both would need some OPC added during decomposition, but the same OPC corrections would apply in both cases.

Figure 13A:
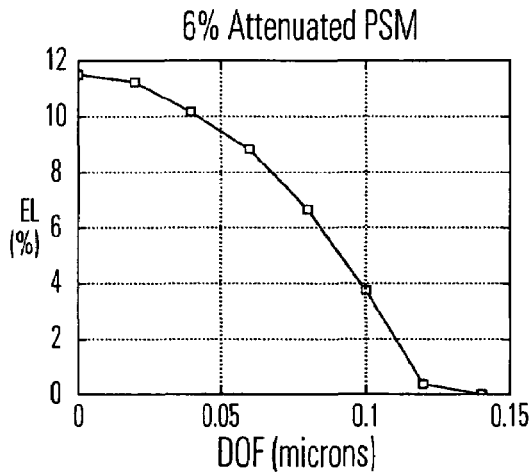
Figure 13B:
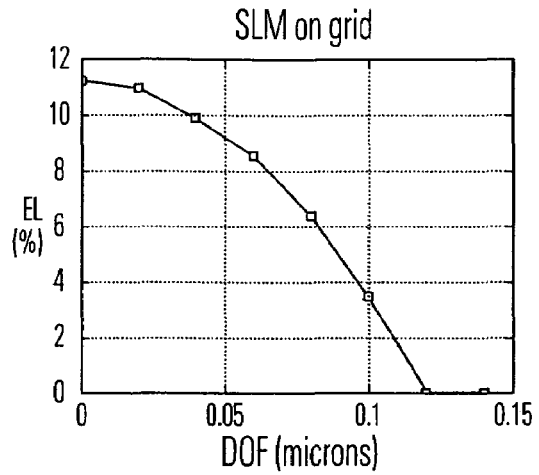
Figure 13C:
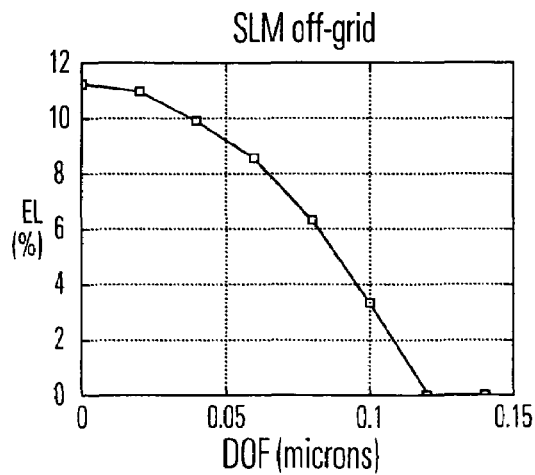

The next example shows exposure latitude windows for a semi-isolated line with scatter bars. The line is 50 nm, 1.67 pixels, and the scatter bars are 20 nm or 0.67 pixels wide. The three graphs in FIG. 13 show the EL windows using a 6% attenuated PSM reticle (FIG. 13a), the SLM image on grid (FIG. 13b) and the SLM image off grid (FIG. 13c). The EL windows are not perfectly identical, which may be due to the tuning of the grid filter. It could easily be set to give a larger window, as will be shown further on. However, the example should be convincing that the SLM has the same OPC properties as the mask, even though in this case the OPC figures are smaller than a pixel.

Will the results be worse in resist? There will probably be some amount of residual errors, since we are dealing with a more complex system. But the grid filter removes the variation through grid placement of the log-slope and therefore of resist wall angle. Since for typical patterns only the first diffraction order from the reticle/SLM pattern makes it to the resist, there are too few degrees of freedom in the image to give much variation once CD and log-slope are fixed. Therefore, the resist results should match those in aerial image.

It appears that the SLM can be made to match an ideal reticle closely in terms of OPC properties. A real reticle is not ideal; the observed differences in the OPC model are due to the physical reticle, not the SLM. It may be possible to detune the maskless tool, but most practical is probably to use two OPC models for the real reticle and SLM if the difference is deemed important. Compare the difference in corner pullback in FIG. 11 for an indication. It is useful that the images are close and the differences well understood, so that successful printing on the maskless tool gives confidence that the device will print successfully with a reticle after a deterministic procedure of pattern conversion.

Phase-shifting Mirrors

The micro-mechanical mirrors have high and uniform reflection. The near-field of the mask and SLM certainly look different. FIGS. 14a-14b depict near-field wave fronts from a transmission reticle (a) and a micro-mirror SLM (b). The incoming waves are not shown. The near-field wave fronts from the SLM are processed optically to produce intensity variation at the image plane. How does the SLM produce a high-contrast image, an image that is nearly identical to that from the mask?

FIG. 15 shows one way of looking at the function of a diffractive SLM image: as 2D modulation and filtering. The mask 1512 creates a diffraction pattern with sidebands surrounding the illumination beam 1514. All information about the mask pattern is carried in the phase and amplitude of these sidebands. The aperture 1516 cuts out a center portion of the diffraction pattern, i.e. low-pass filters the sidebands, and the image is formed after taking the modulus squared of the complex amplitude in the image plane 1518. This system can be analyzed as straightforward Fourier optics. The top and bottom rows of FIG. 15 compare an image forming in a mask-based with an SLM-based imaging system.

The diffractive SLM 1522 has a surface structure that creates sidebands 1524 that are far outside of the aperture 1526. A radio engineer would say that the SLM provides a carrier frequency, actually several two-dimensional spatial carriers. When all mirrors are actuated for dark, it means that the zero order illumination beam is extinguished. There is no light passing through the aperture and the image on the wafer is dark. When the surface structure is modulated by a pattern, the zero-order reemerges, but surrounded by sidebands that carry information about the pattern. The aperture 1526 truncates the sidebands 1524 and an image 1528 is formed. This image 1528 is identical to the one from the mask 1518 because the sidebands are the same. There are also sidebands around each one of the carrier frequencies, as shown in the figure. The different near-fields (FIG. 14) can give an identical image (1518, 1528) because of the amplitude belonging to the carrier frequencies with sidebands.

FIG. 16 depicts an alternating row layout used in some SLMs. The tilt angle is exaggerated by a factor of approximately 50 times, to make the tilt recognizable. The SLM modulation is a phase modulation that is converted to amplitude modulation in the Fourier stop, i.e. the aperture in the projection system. This conversion is not general and automatic, but a result of deliberate mirror design, mirror size and the layout of the tilt pattern, cf. FIG. 16. The detected image is identical to the image from the mask if two conditions are met: the sidebands should be symmetrical and the carrier should be high enough to avoid contamination in the aperture by the sidebands around the carrier frequencies. The image may not contain any phase information, i.e. the complex amplitude should be real at all points. This can most easily be understood if one considers ordinary phase-shift reticles. There are no phase-shift reticles with any other phase than 0 and 180 degrees, and the phase angle is tightly specified and closely monitored. The tolerance for phase shifts is different in the SLM than in a PSM reticle and generally quite complicated, but the same general rule holds: there should be no significant imaginary part of the complex amplitude in the image. If there are phase differences in the image plane, there will be instability through focus, i.e. the edges will move through focus, and CD and/or overlay will be adversely affected.

The other condition, no contamination in the aperture stop by sidebands from the carriers, is easily met by making the mirrors smaller, but with a high penalty in throughput. It is not important how the surface is wrinkled to diffract the light, as long as the extinction of the zero order is produced and the carriers are far enough away from the aperture. Pistons, tilting mirrors or sinusoidal height modulation are all useable. For the tilting mirrors a layout with rows with mirrors tilting left and right gives a large clean area around the zero order, reducing contamination. The diffraction pattern is the one shown in FIG. 15.

Piston vs. tilting mirrors

With the tilting mirrors, the real-valued behavior can be assured by symmetry. It has been proposed that piston mirrors would give higher contrast and image log-slope. It is indeed easy to set up an example with piston mirrors working as a chromeless mask and an on grid feature that will give the high contrast of a chromeless mask. It is less easy, but still possible, to emulate a chromeless mask with 1D features off grid. In this case intermediate mirror values must be used, which for pistons are non-real. Groups of mirrors can be optimized to cancel the phase effects. Satisfying the phase cancellation condition and at the same time keeping CD and log-slope at their design values in a general 2D pattern is more difficult, and impossible above some mirror size.

With piston mirrors the balance of phase is not automatic as with the tilting mirrors, but must be explicitly controlled by the rasterizer. The mirror layout of FIG. 16, with rows of mirrors tilting in alternate directions, can be rasterized as if the mirrors were real-valued amplitude modulators, i.e. each mirror is essentially rasterized based on local data only for that same pixel. This makes the data path architecture simple and the rasterization can be done with explicit algorithms suitable to run in a pipe-lined DSP architecture implemented in FPGAs. Piston mirrors will need a more elaborate rasterizing architecture, and at the same time a larger number of mirrors, smaller in size. Do we need to take these complications if we want to exploit the higher contrast of phase-shifting mirrors? The ext section will give a simpler phase-shifting solution.

Phase-shifting Tilt Mirrors

Figure 17:
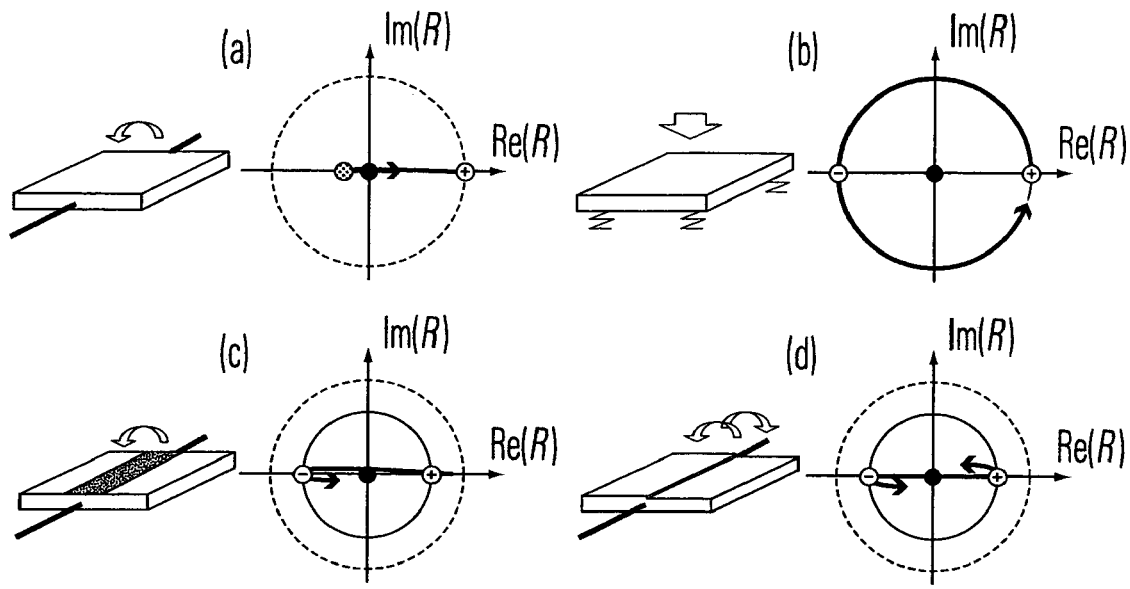

FIGS. 17a-17d depict phase modulation mirror types and trajectories in the complex plane. The panels show an (a) flat tilting mirror, (b) piston mirror, (c) flat tilting mirror with darkened center, and (d) tilting mirror with phase step. Tilting mirrors can be modified to give strong phase-shifting as shown in FIGS. 17c-d. The automatic balance of phase is preserved, as is the simple mechanics, and all points on the real axis of the complex plane become accessible for a single mirror. The same SLM can be used for binary, attenuated, high-transmission attenuating, three-tone, alternating aperture, phase edge, and CPL modes. The only disadvantage is a loss in brightness of approximately two times.

The complex amplitude R is calculated as $$R = \oint_S r(x, y) \cdot e^{\frac{-i4\pi h(x,y)}{\lambda}} dx dy$$

where S is the surface of the mirror, r(x,y) the local complex reflection coefficient, $\lambda$ the wavelength and h(x,y) is the local height. For the piston mirror the complex amplitude is calculated as $$R = R_0 \cdot e^{\frac{-i4\pi h}{\lambda}}$$

i.e., a phase factor times a constant integrated reflectivity $R_0$.

The four mirror types and the trajectories that their integrated complex reflection coefficient R runs through in the complex plane when they are actuated. FIG. 17a shows the current mirror used in the Sigma mask writers. R goes from 1+0i at 0 degrees deflection at the edge of the mirror to −0.2+0i at 257 degrees. The negative amplitude is available to mimic an attenuated PSM, or it can be used as a blacker-than-black color in the grid filter. The theoretical value −0.2 is too small for grid filter and negative black/attenuated PSM mode simultaneously, but real devices have more negative amplitude, typically −0.3. The value can furthermore be changed by the design of the mirror.

FIG. 17b presents a piston mirror. The complex reflection follows the perimeter of the unit circle and is very bright at all phase values. Any point inside the circle, i.e. black and values of gray, can only be accessed through a combination of two or more mirrors.

FIG. 17c shows a tilting mirror that has a central part along the axis darkened by a non-reflecting coating, a light-scattering microstructure, or a cut-out. When area is removed from the center, the amount of negative amplitude increases, while the reflection in the flat state is reduced making the trajectory more symmetrical, but at the same time smaller. It is, however, possible to scale the figure by changes in the illuminating energy, so that the values 0.5+0i and −0.5+0i can be used as clear and shifter. In contrast to a regular scanner, the maskless tool has laser energy to burn. Twenty times lower throughput means twenty times less energy required in the wafer plane.

FIG. 17d shows a different tilting phase-shifting device, the step mirror. It has a phase step in the surface of $\lambda/4$, corresponding to 180 degrees phase shift in reflection. Since half of the area is shifted 180 degrees, it is dark when flat. Tilting to the right makes it brighter up to approximately 50% reflection. Tilting to the left also makes it brighter, but with 180 degrees phase difference. This mirror has several advantages, which makes it useful also for binary printing. In particular, it is very dark when it is not activated, a property that simplifies the stitching of consecutive SLM images. The complex amplitude is symmetrical around the origin of the complex plane, a desirable property for CPL, phase edges and AAPSM modes. When the step mirror is used for three-tone patterns, the values can be chosen arbitrarily along the real axis, e.g. for three-tone high-transmission attenuated mode, or CPL with a weaker shifter than −1+i0.

Data Path for Phase Shifting

Figure 18:
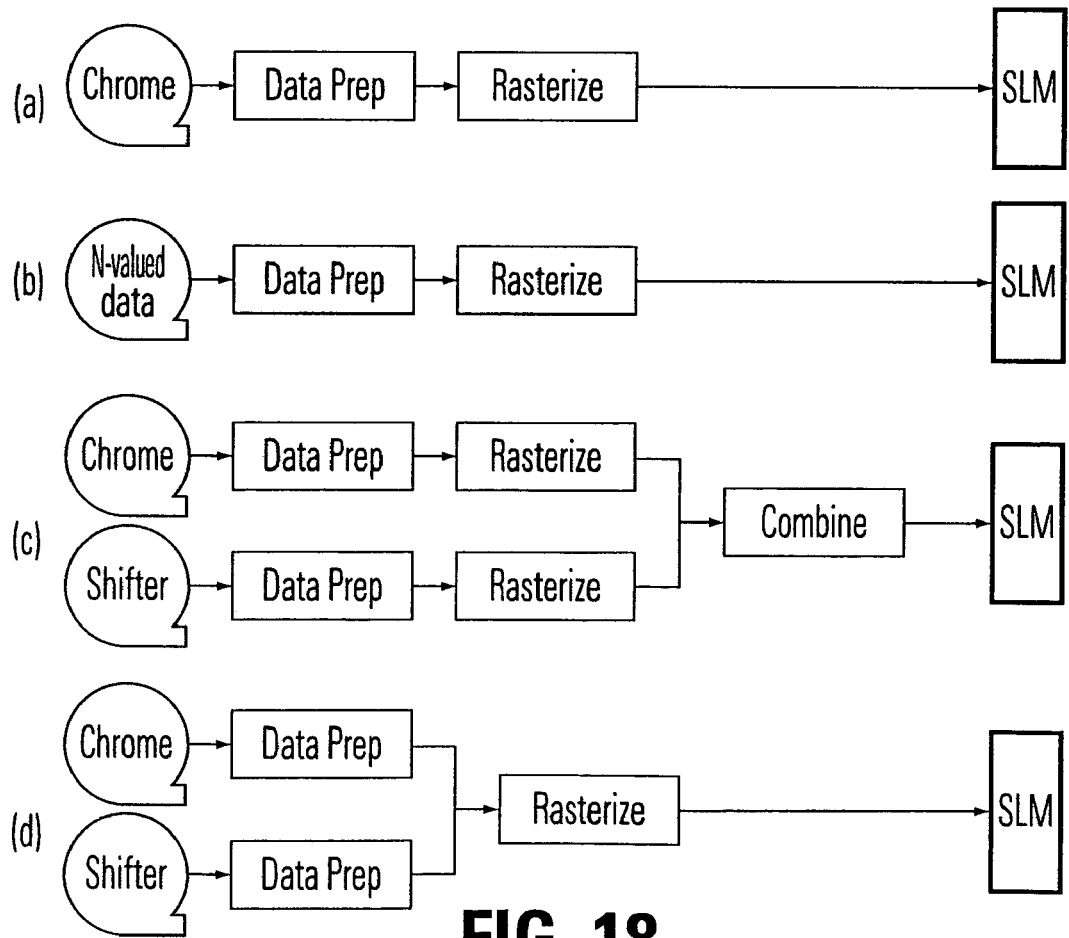

FIGS. 18a-18d depict various data paths: (a), Ideal data path with proprietary data format specifying many area types in the same file (b), Modified data path, compatible with current infrastructure, can be generalized to any number of layers (c), Modified version of c where the layers are not rasterized separately (d). In contrast to the data path shown in FIGS. 18a-18b, patterns other than binary and attenuated PSMs have more than two levels in the pattern input data. As phase-shift reticles are produced today, the input data describes two separate layers for the mask writer, chrome and shifter layers as separate files using a standard format such as GDSII or OASIS. It is desirable to be compatible with this input specification, especially since the layers are not functionally identical. The shifter is typically larger in data than intended on the reticle, since it is masked by the chrome. FIG. 18c shows a data path that reads two files, rasterizes them separately and combines the bitmaps to one single bitmap for the SLM. The grid filter may be used on this single bitmap. FIG. 18b shows how the same two layers can be combined to specify not three area types, but four using a proprietary data format. In general it would be possible to describe a pattern with N tones by the same type of custom format.

A data path with double rasterizers will undoubtedly be more expensive to build. It may or may not be advantageous to develop a new rasterizer that converts the two or more standard input layers directly to multi-valued bitmap, see FIG. 18d. More work remains to be done in this area to explore the most useful rasterizer for phase-shifting and multi-tone images.

Phase-shifting Examples

FIG. 19 presents a schematic description of how to print a 35 nm transistor gate with a phase edge and a trim mask using SLMs (a) and reticles (b). The resist profile of a 35 nm line printed using a phase edge produced by an SLM is shown in (c). Several placements relative to the grid are overlaid, as seen in the magnified portion of (c). FIG. 19 shows a simulated example of a phase edge using the step mirrors of FIG. 9d and a grid filter modified to work in the phase-shifting domain. FIGS. 19a-b show in schematic form how a transistor gate structure is formed by a phase edge and a trim mask with either normal reticles (19b) or SLMs (19a). For the SLM and the reticle, 0 and 180 denotes the phase of the reflected/transmitted light, while the gray level denotes tilted black SLM mirrors. The simulation in FIG. 19c shows the resist profiles for the phase edge for placements of 0, 5, 10, 15, 20, 25 and 30 nm relative to the mirror grid. The target CD is 35 nm, in accordance with the 65 nm node. It is noteworthy—even surprising—that a line hardly wider than a single pixel can be made to move through grid with great consistency in shape, with change that is only visible in the simulation results when highly magnified. The explanation for this surprising lack of grid effect is the combination of the grid filter and the fact that the line is made small by means of overexposure.

The next example is shown in FIG. 20: CPL semi-isolated lines with 65 and 45 nm line widths. In CPL, a shifter line on the reticle, possibly with chrome on it to reduce the transmission, is printed at extreme sigma. The result is a thin dark line with good contrast and insensitivity to mask CD. The two examples shown here show that CD and contrast can be preserved when the line is moved through grid. For the simulation the step mirror in d was used. The result is again a line with neither CD nor contrast dependence on the position relative to the grid.

Enabling Phase-shifting for ASICs

Making PSM reticles will never be simple or easy. Repairing the shifter will always be difficult and because of the optical power of phase-shifting the tolerances will always be tight. The stronger the phase-shifting, the more difficult to produce. The difficulty of building a phase-shifting maskless tool is of a different kind. The difficulty is in the development and when a functioning system exists, it will write phase-shifting patterns just as easily as binary ones. Why would one use binary patterns for gates, when CPL does not cost more and does not take longer?

Even if the assumption that phase-shifting and binary take the same time and cost the same were not fully true, the availability of phase-shifting maskless tools would still tilt the field in favor of more aggressive designs and processes. Even if it would turn out that phase-edge poly layers needed to be written in four passes instead of two, it would enable the ASIC industry to turn up the clock speed and provide more performance advantage over FPGAs.

But could phase-shifting prototypes ever be transferred to reticle-based production? Perhaps not, perhaps it would still be more economical to continue to run the phase-shifted layer(s) maskless even in quite large volumes. With a functioning tool the door would be open to higher performance in small volumes and the transfer to reticles would be done case by case based on economics and logistics. Perhaps a maskless-only process would make sense.

Pixel Size

Note that the phase-shifting examples all use the same pixel size, 30 nm. This size had previously been selected as suitable (though slightly conservative) for binary and attenuated imaging modes. With phase-shifting the printed features are smaller, but contrary to expectation the simulations reported here indicate that 30 nm is still adequate. This result, obviously due to the grid filter, is still preliminary. It is always possible to make printing better and more ideal by using a smaller pixel, albeit with a penalty in throughput.

Litho-Neutral, Litho-Match, and Litho-Plus

The maskless tool can be run with different relations to the normal scanner. In a context where it is used for prototyping and subsequent production, without ever going to masks, the transparency between mask and maskless may not be an issue. This can be called Litho-Neutral, in contrast to the situation where matching is required—Litho-Match.

Litho-Match is a challenging concept. Maximizing the process window and letting the OPC software take care of the proximity effects is simpler and more straight-forward than to match the OPC of a different machine. This is known from mask lithography were the same optical setting on two scanners of different type often do not print the same because of residual aberrations and non-perfect matching of the illuminators. For transparent prototyping it is important that the maskless tool is neither better nor worse than the scanner. Worse imaging causes needless rework, but better image quality in the maskless tool may cause a product to fail when it is transferred to mask-based production.

By the same principle, the term Litho-Plus can denote a situation where printing performance in the maskless tool has higher priority than matching. The two most obvious ways of achieving Litho-Plus is pattern decomposition into partial patterns that are printed with different optical settings and digital processing of the bitmap. Double-pass and multiple-pass printing in a stepper is hampered partly by overlay accuracy, partly by the cost of double reticles. For the maskless tool the trade-offs are different: overlay is very good since neither wafer nor reticle needs to be realigned and the fixed cost of double reticles is absent. On the other hand the throughput is inversely proportional to the number of passes. Despite this it may be possible and useful to decompose a pattern not only in x and y lines, but in logic and memory, in dense and isolated features, or in different pitches. An example is a dense contact hole array that can be printed in negative resist by crossing high-contrast lines formed by phase-shifting. Polarization is another reason for decomposition, especially for NAs above 1.00.

The grid filter has been described as a way of achieving uniformity through grid, but to it can be added a convolution with another kernel, typically derivating. If a derivating kernel is applied to the entire pattern all edges become sharper—exaggerated, if you want—which will give thin lines and small features a boost. The trade-off is that the processed edges must still fit into the dynamic range of the pixel, leading to more digital noise and a need for more laser energy. With addition of a small derivating term to all edges the ED windows in FIG. 13 could have been made larger for the SLMs. A derivative term on all edges can be added to the grid filter with small changes to the architecture, FIG. 9.

SUMMARY

The rasterization from the Sigma mask writers, which preserve CD through grid, has been taken one step further and does now preserve both CD and log-slope through off grid placements of features. The SLM image is very close to that of an ideal image of the data with no visible grid and no loss in resolution. This makes the use of pixels very effective and three of the simulations in the paper show lines that are below two pixels wide, still printing well.

Compared to the image from a physical reticle, the image from the SLM is no worse, rather better since a number of steps have been removed that in a physical reticle limit resolution and accuracy. On top of this, the digital filter can be used to raise the contrast above what is possible with a physical reticle.

The target of the baseline design is to match the image properties of a mask based scanner for seamless mix-and-match and for transparent transfer of the design between mask and maskless lithography.

These results indicate that a maskless tool can be built to give the same OPC model as a mask-based scanner. The OPC properties are, after the grid filter has removed the influence of the finite pixel size, entirely determined by the projection optics and illumination conditions.

A maskless tool has its highest utility on the most difficult layers, typically phase-shifted and highly OPCed. The tilting mirror used in Micronics's mask writers has been modified to provide strong phase shifting properties. While retaining simple mechanical properties, it can be actuated to produce any complex amplitude on the real axis from −1+0i to +1+0i. The current data path can only rasterize a pattern described as two levels, but a modified data path, which can do three-tone and multi-tone patterns, has been described.

The examples shown, all related to the baseline optics targeted for the 65 nm design node ($\lambda$=193, NA=0.93 dry, and 30 nm projected pixel size), include semi-isolated lines of 50 nm (attPSM), 45 nm (CPL, dipole), and 35 nm (phase edge). It is believed that these are the most challenging cases for the maskless tool, since the line widths are two mirrors or smaller and the grid filter is less effective for dipole illumination than for less extreme illumination modes.

The final conclusion is that the scale of all CD errors in this paper is negligible compared to the CD error budget. This result, which will have to be confirmed by more experiments and further simulations, does not say that there will no CD errors, it says that they will have to come from other sources.

Some Particular Embodiments

The present invention may be practiced as a method or device adapted to practice the method. The invention may be an article of manufacture such as media impressed with logic to carry out maskless emulation of phase-shifting methods and generation of OPC features.

One embodiment is a method of exposing lithographic patterns, including providing a spatial light modulator (SLM) having at least one mirror having a complex reflection coefficient with a negative real part and an adjacent mirror having a complex reflection coefficient with a positive real part. Throughout this application, adjacent means either adjoining or within five mirrors, as the interference effects of relaying partially coherent light from nearby micromirrors is limited by their proximity. The method further includes illuminating said SLM with the partially coherent beam and converting vector data to drive said SLM. The vector input data includes more than two beam relaying states, is used in one or more methods of lithographic image enhancement used with reticles. These methods of lithographic image enhancement are chosen from among the group of CPL, phase edge, alternating aperture (Levinson type), three tone or high-transmittance attenuating lithography. The more than two beam relaying states may include fully on and fully off plus either a gray area or a phase shifted area, described in vector data before rasterizing.

A further aspect of the first embodiment includes defining one or more pattern edges with the SLM using at least one mirror oriented to have a complex reflection coefficient with a negative real part, emulating one or more of the methods of lithographic image enhancement.

A series of the additional embodiments involve emulating particular methods of lithographic image enhancement. One of these embodiments is a method of forming lithographic patterns on an image plane on a work piece using a spatial light modulator having one or more mirrors having a complex reflection coefficient with a negative real part, using the partially coherent light, including illuminating the SLM with the partially coherent light. The method further includes driving the mirrors having the complex reflection coefficient with a negative real part to a phase edge as contrasted with one or more adjacent mirrors and projecting the partially coherent light from the SLM through a finite aperture onto an image plane.

Another these embodiments is a method of forming lithographic patterns on an image plane on a work piece using a spatial light modulator having one or more mirrors having a complex reflection coefficient with a negative real part, using the partially coherent light, including illuminating the SLM with the partially coherent light. The method further includes driving the mirrors having the complex reflection coefficient with a negative real part to emulate phase interference between areas of a CPL mask and projecting the partially coherent light from the SLM through a finite aperture onto an image plane.

A further embodiment is a method of forming lithographic patterns on an image plane on a work piece using a spatial light modulator having one or more mirrors having a complex reflection coefficient with a negative real part, using the partially coherent light, including illuminating the SLM with the partially coherent light. The method further includes driving the mirrors having the complex reflection coefficient with a negative real part to emulate an alternating aperture phase-shifting mask and projecting the partially coherent light from the SLM through a finite aperture onto an image plane.

Yet another embodiment is a method of forming lithographic patterns on an image plane on a work piece using a spatial light modulator having one or more mirrors having a complex reflection coefficient with a negative real part, using the partially coherent light, including illuminating the SLM with the partially coherent light. The method further includes driving the mirrors having the complex reflection coefficient with a negative real part to emulate a three-tone phase-shifting mask and projecting the partially coherent light from the SLM through a finite aperture onto an image plane.

A related embodiment is a method of forming lithographic patterns on an image plane on a work piece using a spatial light modulator having one or more mirrors having a complex reflection coefficient with a negative real part, using the partially coherent light, including illuminating the SLM with the partially coherent light. The method further includes driving the mirrors having the complex reflection coefficient with a negative real part to emulate a high transmission attenuating phase-shifting mask and projecting the partially coherent light from the SLM through a finite aperture onto an image plane.

Another embodiment disclosed is a method of exposing lithographic patterns including providing a spatial light modulator having at least one mirror having a complex reflection component with a negative real part and adjacent mirror having a complex reflection coefficient with a positive real part. This method includes illuminating the SLM with the partially coherent been and converting vector input data to drive the SLM. The vector input data includes OPC features or decompositions, has used to produce lithographic image enhancement used with reticles. The OPC features or decompositions are among the group of scatter bars, serifs, OPC jogs, or double-dipole decompositions.

A series of related embodiments involve emulating OPC features or decompositions as used with reticles. One related embodiment is a method of forming lithographic patterns on an image plane on a workpiece using a spatial light modulator having one or more mirrors having a complex reflection coefficient with a negative real part, using a partially coherent light, including illuminating the SLM with the partially coherent illumination source. The method further includes driving the mirrors to emulate one or more sub-printing resolution scatter bars and projecting the partially coherent light from the SLM through a finite aperture onto an image plane.

Another related embodiment is a method of forming lithographic patterns on an image plane on a workpiece using a spatial light modulator having one or more mirrors having a complex reflection coefficient with a negative real part, using a partially coherent light, including illuminating the SLM with the partially coherent illumination source. The method further includes driving the mirrors to emulate a sub-printing resolution serifs and projecting the partially coherent light from the SLM through a finite aperture onto an image plane.

A further embodiment is a method of forming lithographic patterns on an image plane on a workpiece using a spatial light modulator having one or more mirrors having a complex reflection coefficient with a negative real part, using a partially coherent light, including illuminating the SLM with the partially coherent illumination source. The method further includes driving the mirrors to produce a jogging align pattern, enhanced by a phase difference between adjacent mirrors of the SLM and projecting the partially coherent light from the SLM through a finite aperture onto an image plane.

A yet further embodiment is a method of forming lithographic patterns on an image plane on a workpiece using a spatial light modulator having one or more mirrors having a complex reflection coefficient with a negative real part, using a partially coherent light, including illuminating the SLM with the partially coherent illumination source. The method further includes driving the mirrors to emulate double-exposure dipole decomposition resolution enhancement using multiple exposures of the SLM and projecting the partially coherent light from the SLM through a finite aperture onto an image plane.

Generally, among embodiments, there are methods of direct writing to a workpiece including receiving data that describes one or more masks applying phase shifting techniques to produce an image on the workpiece. These methods further include driving complex amplitude-capable micromirrors of an SLM to emulate the image on the workpiece that would be produced by the one or more masks and illuminating the SLM with partially coherent light and relaying the partially coherent light onto the workpiece. In a further aspect of these methods, the one or more masks applying phase shifting techniques are actually two or more masks of a mask set used to produce an image on the workpiece for a particular pattern layer.

While the present invention is disclosed by reference to the preferred embodiments and examples detailed above, it is understood that these examples are intended in an illustrative rather than in a limiting sense. Computer-assisted processing is implicated in the described embodiments. Accordingly, the present invention may be embodied in methods of emulating mask-based lithography using a phase-shifting SLM, systems including logic and resources to carry out emulation of mask-based lithography using a phase-shifting SLM, media impressed with logic to carry out emulation of mask-based lithography using a phase-shifting SLM, data streams impressed with logic to carry out emulation of mask-based lithography using a phase-shifting SLM, or computer-accessible services that carry out computer-assisted emulation of mask-based lithography using a phase-shifting SLM. It is contemplated that modifications and combinations will readily occur to those skilled in the art, which modifications and combinations will be within the spirit of the invention and the scope of the following claims.

We claim as follows:

1. A method of exposing lithographic patterns, including:
providing a spatial light modulator (SLM) having at least one mirror having a complex reflection coefficient with a negative real part and an adjacent mirror having a complex reflection coefficient with a positive real part,
illuminating said SLM with a partially coherent beam,
converting vector input data to drive said SLM, said vector input data including more than two beam relaying states, including in the vector input data fully on and fully off states plus either a gray state or a phase shifting state; and
driving the mirrors having the complex reflection coefficients to emulate one or more sub-printing resolution scatterbars.

2. The method of claim 1, wherein one or more pattern edges are defined by the SLM using at least one mirror oriented to have a complex reflection coefficient with a negative real part, emulating one or more of the methods of lithographic image enhancement.

3. The method of claim 1, wherein the converted vector data is used to drive the mirrors having the complex reflection coefficient with a negative real part to a phase edge as contrasted with one or more adjacent mirrors.

4. The method of claim 1, wherein the converted vector data is used to drive the mirrors having the complex reflection coefficient with a negative real part to emulate phase interference between areas of a CPL mask.

5. The method of claim 1, wherein the converted vector data is used to drive the mirrors having the complex reflection coefficient with a negative real part to emulate an alternating aperture phase-shifting mask.

6. The method of claim 1, wherein the converted vector data is used to drive the mirrors having the complex reflection coefficient with a negative real part to emulate a three-tone phase-shifting mask.

7. The method of claim 1, wherein the converted vector data is used to drive the mirrors having the complex reflection coefficient with a negative real part to emulate a high transmission attenuating phase-shifting mask.

8. The method of claim 1, wherein the driving the mirrors having the complex reflection coefficient with a negative real part to produce a jog in a line pattern, is enhanced by a phase difference between adjacent mirrors of the SLM.

9. The method of claim 1, applied to direct writing to a workpiece, the method further including:
receiving data that describes one or more masks applying phase shifting techniques to produce an image on the workpiece;
driving complex amplitude-capable micromirrors of an SLM to emulate the image on the workpiece that would be produced by more than one mask; and
illuminating the SLM with partially coherent light and relaying the partially coherent light onto the workpiece.

10. The method of claim 9, wherein the more than one mask applying phase shifting techniques include two or more masks of a mask set used to produce an image on the workpiece for a particular pattern layer.

11. A method of forming lithographic patterns on an image plane on a workpiece using a spatial light modulator (SLM), having one or more mirrors having a complex reflection coefficient with a negative real part, using a partially coherent light source, including:
illuminating the SLM with the partially coherent light;
driving the mirrors having the complex reflection coefficient with a negative real part to emulate double-exposure dipole decomposition resolution enhancement using multiple exposures of the SLM; and projecting the partially coherent light from the SLM through a finite aperture onto an image plane.

12. A method of exposing lithographic patterns, including:
providing a spatial light modulator (SLM) having at least one mirror having a complex reflection coefficient with a negative real part and an adjacent mirror having a complex reflection coefficient with a positive real part, illuminating said SLM with a partially coherent beam, and converting vector input data to drive said SLM, said vector input data including more than two beam relaying states, including in the vector input data fully on and fully off states plus either a gray state or a phase shifting state;

driving the mirrors having the complex reflection coefficients to emulate one or more sub-printing resolution serifs.

13. The method of claim 12, wherein one or more pattern edges are defined by the SLM using at least one mirror oriented to have a complex reflection coefficient with a negative real part, emulating one or more of the methods of lithographic image enhancement.

14. The method of claim 12, wherein the converted vector data is used to drive the mirrors having the complex reflection coefficient with a negative real part to a phase edge as contrasted with one or more adjacent mirrors.

15. The method of claim 12, wherein the converted vector data is used to drive the mirrors having the complex reflection coefficient with a negative real part to emulate phase interference between areas of a CPL mask.

16. The method of claim 12, wherein the converted vector data is used to drive the mirrors having the complex reflection coefficient with a negative real part to emulate an alternating aperture phase-shifting mask.

17. The method of claim 12, wherein the converted vector data is used to drive the mirrors having the complex reflection coefficient with a negative real part to emulate a three-tone phase-shifting mask.

18. The method of claim 12, wherein the converted vector data is used to drive the mirrors having the complex reflection coefficient with a negative real part to emulate a high transmission attenuating phase-shifting mask.

19. The method of claim 12, wherein the driving the mirrors having the complex reflection coefficient with a negative real part to produce a jog in a line pattern, is enhanced by a phase difference between adjacent mirrors of the SLM.

* * * * *

UNITED STATES PATENT AND TRADEMARK OFFICE
CERTIFICATE OF CORRECTION

PATENT NO. : 7,618,751 B2 Page 1 of 1
APPLICATION NO. : 11/066828
DATED : November 17, 2009
INVENTOR(S) : Sandstrom et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1210 days.

Signed and Sealed this

Twenty-sixth Day of October, 2010

David J. Kappos
*Director of the United States Patent and Trademark Office*